(12) United States Patent
Manthena et al.

(10) Patent No.: US 12,154,825 B2
(45) Date of Patent: Nov. 26, 2024

(54) METHODS OF FORMING MICROELECTRONIC DEVICES INCLUDING TIERED STACKS INCLUDING CONDUCTIVE STRUCTURES ISOLATED BY SLOT STRUCTURES, AND RELATED MICROELECTRONIC DEVICES AND ELECTRONIC SYSTEMS

(71) Applicant: Micron Technology, Inc., Boise, ID (US)

(72) Inventors: Raja Kumar Varma Manthena, Boise, ID (US); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 421 days.

(21) Appl. No.: 17/447,505

(22) Filed: Sep. 13, 2021

(65) Prior Publication Data

US 2023/0067814 A1 Mar. 2, 2023

Related U.S. Application Data

(60) Provisional application No. 63/260,817, filed on Sep. 1, 2021.

(51) Int. Cl.
*H10B 41/10* (2023.01)
*H01L 21/768* (2006.01)
(Continued)

(52) U.S. Cl.
CPC .. *H01L 21/76877* (2013.01); *H01L 21/76831* (2013.01); *H01L 23/5226* (2013.01); *H01L 23/5283* (2013.01); *H01L 29/0649* (2013.01); *H10B 41/10* (2023.02); *H10B 41/20* (2023.02); *H10B 41/35* (2023.02); *H10B 43/10* (2023.02); *H10B 43/20* (2023.02); *H10B 43/35* (2023.02)

(58) Field of Classification Search
CPC ......... H01L 21/76877; H01L 21/76831; H01L 23/5226; H01L 23/5283; H01L 29/0649;
(Continued)

(56) References Cited

U.S. PATENT DOCUMENTS 8,394,716 B2 * 3/2013 Hwang ............... H01L 23/5226
257/315
8,395,190 B2 * 3/2013 Shim ................. H01L 21/02365
257/329

(Continued)

OTHER PUBLICATIONS

Vadivel et al., Microelectronic Device Structures Including Tiered Stacks Comprising Staggered Block Structures Separated By Slot Structures, and Related Electronic Systems and Methods, filed Dec. 3, 2020, U.S. Appl. No. 17/111,275, 56 pages.

*Primary Examiner* — Eduardo A Rodela
(74) *Attorney, Agent, or Firm* — TraskBritt

(57) ABSTRACT

A method of forming a microelectronic device comprises forming a stack structure over a source structure, forming pillar structures vertically extending through the stack structure, and forming at least one trench vertically extending through the stack structure. The at least one trench defines at least one stadium structure comprising opposing stair step structures having steps comprising horizontal ends of tiers. Additional trenches may be formed to vertically extend through the stack structure, and at least one further trench may be formed to vertically extend through the stack structure. The at least one further trench defines at least one additional stadium structure comprising additional opposing stair step structures having additional steps comprising additional horizontal ends of the tiers. A dielectric material may be formed within the at least one trench, the additional trenches, and the at least one further trench. Microelectronic devices, memory devices, and electronic systems are also described.

24 Claims, 27 Drawing Sheets

(51) Int. Cl.

| | |
|---|---|
| *H01L 23/522* | (2006.01) |
| *H01L 23/528* | (2006.01) |
| *H01L 29/06* | (2006.01) |
| *H10B 41/20* | (2023.01) |
| *H10B 41/35* | (2023.01) |
| *H10B 43/10* | (2023.01) |
| *H10B 43/20* | (2023.01) |
| *H10B 43/35* | (2023.01) |

(58) Field of Classification Search
CPC ........ H10B 41/10; H10B 41/20; H10B 41/35; H10B 43/10; H10B 43/20; H10B 43/35; H10B 43/00; H10B 43/23; H10B 43/27; H10B 43/30; H10B 43/40; H10B 43/50
See application file for complete search history.

(56) References Cited

U.S. PATENT DOCUMENTS

| | | | |
|---|---|---|---|
| 8,933,502 B2 * | 1/2015 | Higashitani | G11C 16/0483 |
| | | | 257/326 |
| 8,952,448 B2 * | 2/2015 | Yang | H01L 27/088 |
| | | | 257/329 |
| 9,530,790 B1 * | 12/2016 | Lu | H01L 29/7883 |
| 9,941,209 B2 | 4/2018 | Tessariol et al. | |
| 11,437,391 B2 * | 9/2022 | Manthena | H10B 43/40 |
| 11,818,888 B2 * | 11/2023 | Manthena | H10B 41/10 |
| 2011/0121403 A1 * | 5/2011 | Lee | H10B 41/27 |
| | | | 257/E27.06 |
| 2017/0069655 A1 * | 3/2017 | Ichinose | H01L 21/31111 |
| 2017/0263625 A1 * | 9/2017 | Kikutani | H01L 23/5283 |
| 2020/0211981 A1 | 7/2020 | Kothari et al. | |
| 2021/0126010 A1 | 4/2021 | Luo et al. | |

* cited by examiner

METHODS OF FORMING MICROELECTRONIC DEVICES INCLUDING TIERED STACKS INCLUDING CONDUCTIVE STRUCTURES ISOLATED BY SLOT STRUCTURES, AND RELATED MICROELECTRONIC DEVICES AND ELECTRONIC SYSTEMS

CROSS-REFERENCE TO RELATED APPLICATION

This application claims the benefit under 35 U.S.C. § 119(e) of U.S. Provisional Patent Application Ser. No. 63/260,817, filed Sep. 1, 2021, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more conductive stack structures including tiers of conductive structures and insulative structures. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the conductive stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the conductive stack structure(s) of the memory device. The staircase structure includes individual "steps" defining contact regions of the conductive structures, upon which conductive contact structures can be positioned to provide electrical access to the conductive structures.

Unfortunately, as feature packing densities have increased and margins for formation errors have decreased, conventional methods of forming memory devices (e.g., NAND Flash memory devices) have resulted in undesirable current leaks (e.g., access line to source plate current leaks) and short circuits that can diminish desired memory device performance, reliability, and durability. For example, conventional methods of partitioning a preliminary stack structure including tiers of insulative structures and additional insulating structures into blocks and sub-blocks may result in undesirable conductive material depositions during subsequent processing of the preliminary stack structure (e.g., so called "replacement gate" or "gate last" processing of the preliminary stack structure to replace one or more portions of the additional insulating structures with conductive structures to form the conductive stack structure of a memory device) that can effectuate undesirable leakage currents and short circuits. Further, conventional methods of forming the memory devices have resulted in undesirable tier deformations (e.g., tier warping) and/or tier collapse during the formation of the conductive structures. In addition, structures (e.g., pillars) within the conductive stack structure having a high aspect ratio may be particularly prone to distortion (e.g., bowing, bending, warping, etc.) along a height thereof.

DETAILED DESCRIPTION

Figure 1A:
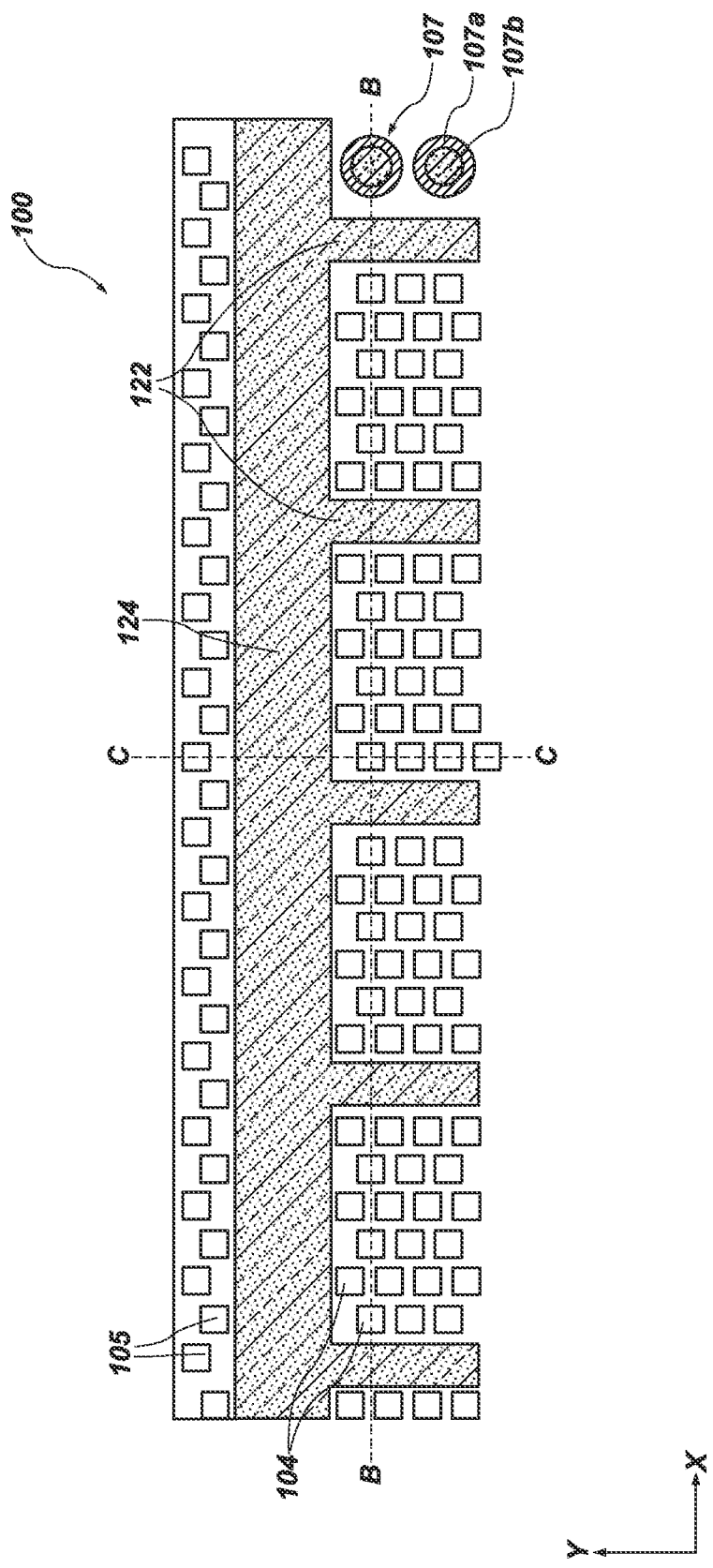
FIGS. 1A through 4C are simplified, partial top-down views (i.e., FIGS. 1A, 2A, 3A, and 4A) and simplified, partial cross-sectional views (i.e., FIGS. 1B, 1C, 2B, 2C, 3B, 3C, 4B, and 4C) illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the claims. The drawings are not necessarily to scale. Additionally, elements common between figures may retain the same numerical designation.

As used herein, a "memory device" means and includes a microelectronic device exhibiting memory functionality, but not necessarily limited to memory functionality. Stated another way, and by way of non-limiting example only, the term "memory device" includes not only conventional memory (e.g., conventional non-volatile memory, such as conventional NAND memory; conventional volatile memory, such as conventional dynamic random access memory (DRAM)), but also includes an application specific integrated circuit (ASIC) (e.g., a system on a chip (SoC)), a microelectronic device combining logic and memory, and a graphics processing unit (GPU) incorporating memory.

As used herein, the term "intersection" means and includes a location at which two or more features (e.g., regions, structures, materials, trenches, devices) or, alternatively, two or more portions of a single feature meet. For example, an intersection between a first feature extending in a first direction (e.g., an X-direction) and a second feature extending in a second direction (e.g., a Y-direction) different than the first direction may be the location at which the first feature and the second feature meet.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "pitch" between two neighboring features refers to a distance between corresponding locations (e.g., points) within the two neighboring features.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide (MgO)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless otherwise specified, materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

FIGS. 1A through 4C are simplified, partial top-down views (i.e., FIGS. 1A, 2A, 3A, and 4A) and simplified, partial cross-sectional views (i.e., FIGS. 1B, 1C, 2B, 2C, 3B, 3C, 4B, and 4C) illustrating embodiments of a method of forming a microelectronic device structure of a microelectronic device (e.g., a memory device, such as a three-dimensional (3D) NAND Flash memory device). With the description provided below, it will be readily apparent to one of ordinary skill in the art that the methods and structures described herein may be used in various devices. In other words, the methods of the disclosure may be used whenever it is desired to form a microelectronic device. For convenience in describing FIGS. 1A through 4C, a first horizontal direction may be defined as the X-direction shown in some of FIGS. 1A through 4C; a second direction transverse (e.g., orthogonal, perpendicular) to the first direction may be defined as the Y-direction shown in some of FIGS. 1A through 4C; and a third direction transverse (e.g., orthogonal, perpendicular) to each of the first direction and the second direction may be defined the Z-direction shown in some of FIGS. 1A through 4C. Similar directions are shown in FIGS. 5A through 8C and 9, which are discussed in further detail below.

Figure 1B:
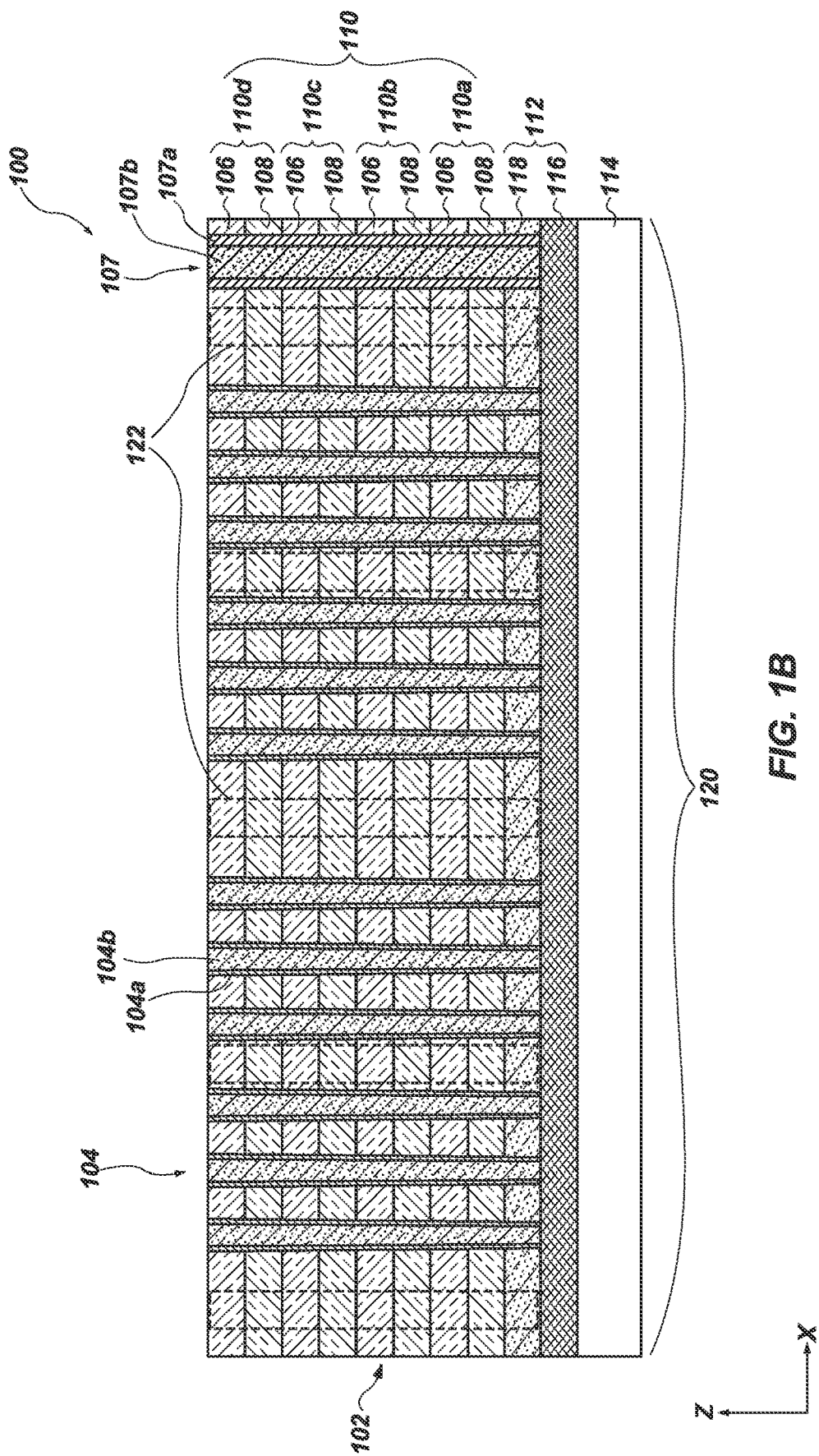
Figure 1C:
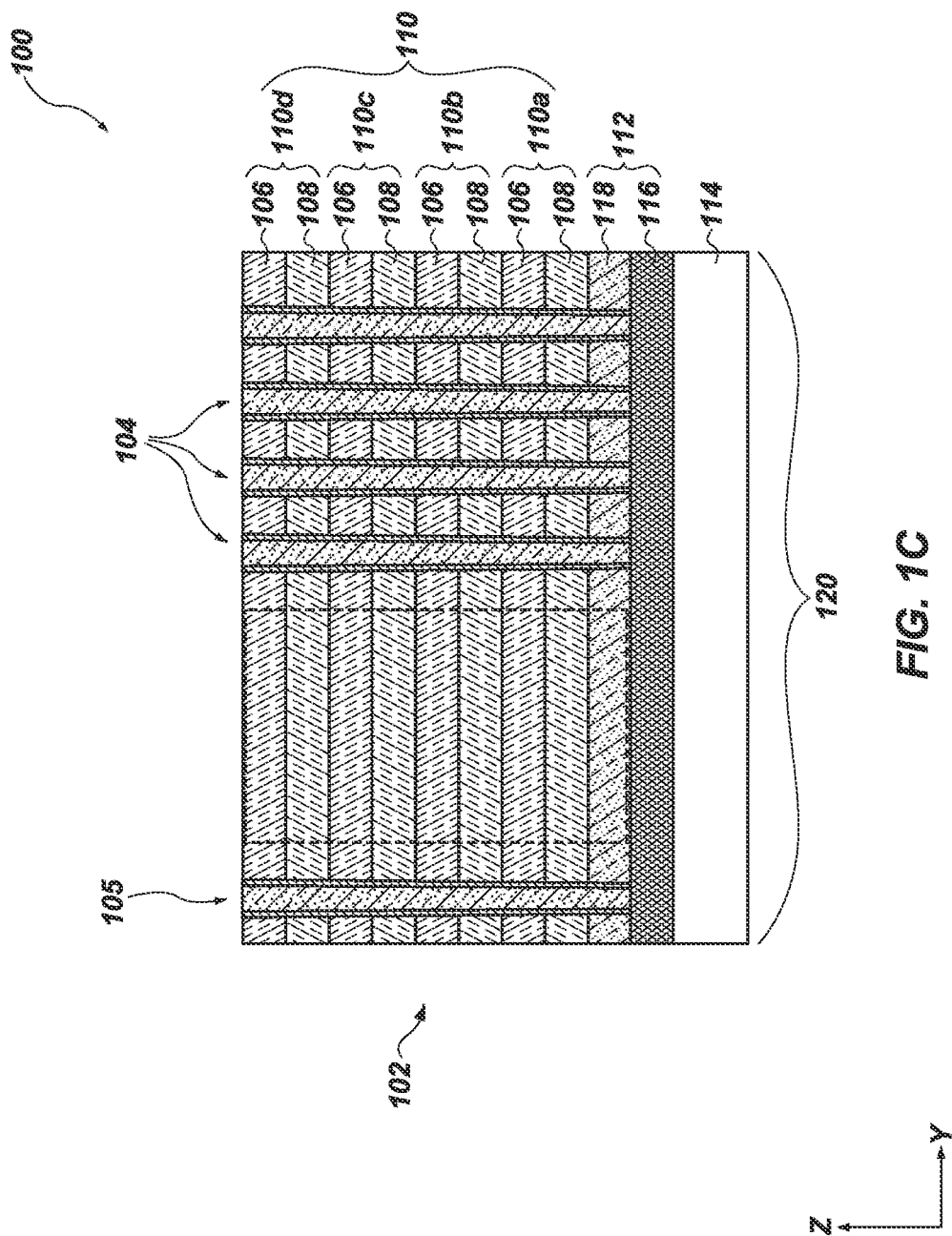

Referring to FIG. 1A, a microelectronic device structure 100 may be formed to include first pillar structures 104 and second pillar structures 105. The first pillar structures 104 and the second pillar structures 105 may extend vertically (e.g., in the Z-direction) through a preliminary stack structure 102 (FIGS. 1B and 1C, described in further detail below). The first pillar structures 104 may be separated from the second pillar structures 105 by at least one second trench region 124 extending in a first horizontal direction (e.g., the X-direction). Neighboring blocks of the first pillar structures 104 may be horizontally separated from one another by first trench regions 122 extending in a second horizontal direction (e.g., the Y-direction) orthogonal to the first horizontal direction. Different first pillar structures 104 may be horizontally aligned with one another in columns extending in the second horizontal direction. For clarity and ease of understanding the description, FIG. 1A illustrates a particular quantity of columns of the first pillar structures 104 between horizontally neighboring first trench regions 122. However, it will be understood that the microelectronic device structure 100 may include a greater quantity of columns of the first pillar structures 104 between the horizontally neighboring first trench regions 122 than those illustrated. In addition, support structures 107 (e.g., mechanical support pillars) may, optionally, be formed between at least some of the first trench regions 122. The support structures 107 may be formed to horizontally neighbor one or more areas designated for the first pillar structures 104, although other configurations may be contemplated. The preliminary stack structure 102, including the first trench regions 122 and the second trench region 124 thereof, is described in further detail below. Additional features of the microelectronic device structure 100 at the processing stage depicted in FIG. 1A are also described in further detail below. FIG. 1B is a simplified, partial cross-sectional view of the microelectronic device structure 100 about the line B-B shown in FIG. 1A, and FIG. 1C is a simplified, partial cross-sectional view of the microelectronic device structure 100 about the line C-C shown in FIG. 1A. For clarity and ease of understanding of the drawings and related description, not all features depicted in one of FIGS. 1A through 1C are depicted in each of the others of FIGS. 1A through 1C.

Referring to FIGS. 1B and 1C, the preliminary stack structure 102 may be formed to include a vertically alternating (e.g., in the Z-direction) sequence of insulating structures 106 and additional insulating structures 108 arranged in tiers 110. Each of the tiers 110 may include at least one of the insulating structures 106 and at least one of the additional insulating structures 108 vertically adjacent to the insulating structure 106. For clarity and ease of understanding of the drawings and related description, FIGS. 1B and 1C show the preliminary stack structure 102 as including four (4) tiers 110 (e.g., a first tier 110a, a second tier 110b, a third tier 110c, a fourth tier 110d) of the insulating structures 106 and the additional insulating structures 108. However, the preliminary stack structure 102 may include a different quantity of tiers 110. For example, in additional embodiments, the preliminary stack structure 102 includes greater than four (4) tiers 110 (e.g., greater than or equal to ten (10) tiers 110, greater than or equal to twenty-five (25) tiers 110, greater than or equal to fifty (50) tiers 110, greater than or equal to one hundred (100) tiers 110) of the insulating structures 106 and the additional insulating structures 108, or may include less than four (4) tiers 110 (e.g., less than or equal to three (3) tiers 110) of the insulating structures 106 and the additional insulating structures 108.

The insulating structures 106 of the preliminary stack structure 102 may be formed of and include at least one insulative material. In some embodiments, the insulating structures 106 are individually formed of and include silicon dioxide ($SiO_2$). Each of the insulating structures 106 may individually include a substantially homogeneous distribution or a substantially heterogeneous distribution of the at least one insulative material. The insulating structures 106 may each be substantially planar, and may each independently exhibit any desired thickness. In addition, each of the insulating structures 106 may be substantially the same (e.g., exhibit substantially the same material composition, material distribution, size, and shape) as one another, or at least one of the insulating structures 106 may be different (e.g., exhibit one or more of a different material composition, a different material distribution, a different size, and a different shape) than at least one other of the insulating structures 106. In some embodiments, each of the insulating structures 106 is substantially the same as each other of the insulating structures 106.

The additional insulating structures 108 may be formed of and include at least one insulative material that is different than, and that exhibits etch selectivity with respect to, the insulating structures 106. For example, the additional insulating structures 108 may individually be formed of and include at least one dielectric nitride material (e.g., $SiN_y$) or at least one oxynitride material (e.g., $SiO_xN_y$). In some embodiments, the additional insulating structures 108 are formed of and include $Si_3N_4$. Each of the additional insulating structures 108 may individually include a substantially homogeneous distribution or a substantially heterogeneous distribution of the at least one additional insulative material. The additional insulating structures 108 may serve as sacrificial structures for the subsequent formation of conductive structures, as described in further detail below.

With continued reference to FIGS. 1B and 1C, the microelectronic device structure 100 may further include a source tier 112 (e.g., a source level) vertically under (e.g., in the Z-direction) the preliminary stack structure 102, and a base structure 114 vertically under (e.g., in the Z-direction) the source tier 112. The source tier 112 may be vertically interposed between (e.g., in the Z-direction) the preliminary stack structure 102 and the base structure 114. As shown in FIGS. 1B and 1C, the source tier 112 may include at least one source structure 116 (e.g., a source plate; at least one source line, such as a common source line (CSL)), and at least one other insulating structure 118 vertically adjacent (e.g., in the Z-direction) the source structure 116. The other insulating structure 118 may vertically intervene (e.g., in the Z-direction) between the source structure 116 and the preliminary stack structure 102.

The source structure 116 of the source tier 112 may be formed of and include at least one conductive material. In some embodiments, the source structure 116 is formed of and includes tungsten (W). In other embodiments, the source structure 116 is formed of and includes conductively doped polysilicon. The source structure 116 may include a substantially homogeneous distribution of the at least one conductive material, or a substantially heterogeneous distribution of the at least one conductive material. Amounts of the material may vary stepwise (e.g., change abruptly), or may vary continuously (e.g., change progressively, such as linearly, parabolically) throughout different portions of the source structure 116. In some embodiments, the source structure 116 exhibits a substantially homogeneous distribution of conductive material. In additional embodiments, the source structure 116 exhibits a substantially heterogeneous distribution of at least one conductive material. The source structure 116 may, for example, be formed of and include a stack of at least two different conductive materials.

The other insulating structure 118 of the source tier 112 may be formed of and include at least one other insulative material, such as one or more of at least one dielectric oxide material, at least one dielectric nitride material, at least one dielectric oxynitride material, and at least one dielectric carboxynitride material. A material composition of the other insulating structure 118 may substantially the same as a material composition of the insulating structures 106 or the additional insulating structures 108 of the preliminary stack structure 102, or the material composition of the other insulating structure 118 may be different than the material compositions of the insulating structures 106 and the additional insulating structures 108. In some embodiments, a material composition of the other insulating structure 118 is substantially the same as a material composition of the insulating structures 106 of the preliminary stack structure 102. In some embodiments, the other insulating structure 118 is formed of and includes $SiO_2$. The other insulating structure 118 may include a substantially homogeneous distribution or a substantially heterogeneous distribution of the at least one other insulative material thereof.

With continued reference to FIGS. 1B and 1C, the base structure 114 may include at least one logic region including devices and circuitry for controlling various operations of other components of the microelectronic device structure 100. By way of non-limiting example, the logic region of the base structure 114 may include one or more (e.g., each) of charge pumps (e.g., $V_{CCP}$ charge pumps, $V_{NEGWL}$ charge pumps, DVC2 charge pumps); delay-locked loop (DLL) circuitry (e.g., ring oscillators); drain supply voltage ($V_{dd}$) regulators; devices and circuitry for controlling column operations for arrays (e.g., arrays of vertical memory strings) to subsequently be formed within the microelectronic device structure 100, such as one or more (e.g., each) of decoders (e.g., column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices; and devices and circuitry for controlling row operations for arrays (e.g., arrays of vertical memory strings) within memory regions of the microelectronic device structure 100, such as one or more (e.g., each) of decoders (e.g., row decoders), drivers (e.g., word line (WL) drivers), repair circuitry (e.g., row repair circuitry), memory test devices, MUX, ECC devices, and self-refresh/wear leveling devices. In some embodiments, the logic region of the base structure 114 includes complementary metal-oxide-semiconductor (CMOS) circuitry. In some such embodiments, the base structure 114 may be characterized as having a "CMOS under Array" ("CuA") configuration, wherein the CMOS circuitry of the logic region is at least partially (e.g., substantially) positioned within horizontal areas of memory array regions of a microelectronic device including the microelectronic device structure 100.

As shown in FIGS. 1B and 1C, each of the first trench regions 122 and the at least one second trench region 124 include locations designated for subsequent positions of trenches to be formed to vertically extend (e.g., in the Z-direction) substantially through the preliminary stack structure 102. As described in further detail below, first trenches to be formed in the first trench regions 122 (FIG. 1B) and at least one second trench to be formed in the second trench region 124 (FIG. 1C) may individually be formed to vertically extend completely through the tiers 110 (e.g., the first tier 110a, the second tier 110b, the third tier 110c, the fourth tier 110d) of the insulating structures 106 and the additional insulating structures 108 and to terminate at or above the source structure 116.

With continued reference to FIGS. 1B and 1C, the first pillar structures 104 may be formed in an array region 120 (e.g., a memory array region) and may be configured as memory pillar structures (e.g., cell pillar structures). In addition, the second pillar structures 105 (FIG. 1C) may horizontally neighbor (e.g., in the Y-direction) the first pillar structures 104 within the array region 120, and may be configured as so-called "dummy pillars" that are not operably coupled to (e.g., electrically connected to) the source structure 116. The second pillar structures 105 may alleviate undesirable array edge effects within the array region 120. The second pillar structures 105 may be formed in openings vertically extending at least partially through the tiers 110 of the preliminary stack structure 102. The second pillar structures 105 may be formed in the preliminary stack structure 102 using conventional processes (e.g., conventional deposition processes) and conventional processing equipment, which are not described in detail herein. In other embodiments, at least some of the second pillar structures 105 are configured as memory pillar structures and/or some of the first pillar structures 104 are configured as dummy pillars.

The first pillar structures 104 may exhibit a substantially rectangular horizontal cross-sectional shape (e.g., a substantially square horizontal cross-sectional shape) as shown in the top-down view of FIG. 1A. However, the disclosure is not so limited. As a non-limiting example, in additional embodiments, the first pillar structures 104 exhibit a substantially circular horizontal cross-sectional shape. In addition, a pitch between horizontally adjacent first pillar structures 104 may be within a range of from about 50 nanometers (nm) to about 200 nm, such as from about 50 nm to about 100 nm, from about 100 nm to about 150 nm, or from about 150 nm to about 200 nm. In some embodiments, a critical dimension (CD) of an individual first pillar structure 104 in a horizontal direction is within a range of from about 20 nm to about 200 nm, such as from about 20 nm to about 50 nm, from about 50 nm to about 100 nm, from about 100 nm to about 150 nm, or from about 150 nm to about 200 nm, for example. One of ordinary skill in the art will appreciate that the pitch between horizontally neighboring first pillar structures 104 and the critical dimension of an individual first pillar structure 104 may be smaller or larger than the stated ranges and may be selected to achieve desired performance objectives. The second pillar structures 105 may or may not be substantially similarly sized and spaced.

The first pillar structures 104 may be formed in openings vertically extending through the tiers 110 of the preliminary stack structure 102. As shown in FIG. 1C, the first pillar structures 104 may individually include a cell film 104a, and a fill material 104b surrounding the cell film 104a. For example, the cell film 104a may include a cell material formed within the openings, and a channel material formed over the cell material. For convenience, the cell material and channel material are illustrated as a single material (e.g., the cell film 104a) in FIG. 1B. However, the cell film 104a may include both the cell material and the channel material. The cell material and channel material may be formed by conventional techniques, such as by CVD or ALD. The cell material may, for example, be an oxide-nitride-oxide (ONO) material, such as a silicon oxide-silicon nitride-silicon oxide material, that is conformally formed over sidewalls of the first pillar structures 104. The cell material may be formed at a smaller relative thickness than the channel material. The channel material may be conformally formed over the cell material. The channel material may, for example, comprise a semiconductor material, such as polysilicon. The fill material 104b may be formed over the channel material of the cell film 104a and may fill (e.g., substantially fill) remainders (e.g., unfilled portions) of the openings. The fill material 104b may be insulative material, such as an oxide dielectric material (e.g., $SiO_2$). The fill material 104b may be substantially uniform and substantially conformal as deposited. The fill material 104b may be formed by conventional techniques, such as by ALD. In some embodiments, the fill material 104b is an ALD $SiO_x$. The fill material 104b may initially be formed in the openings and over exposed horizontal surfaces of the tiers 110, with the fill material 104b over the tiers 110 subsequently removed, such as by an abrasive planarization process (e.g., chemical mechanical planarization (CMP)). Accordingly, the fill material 104b may be surrounded by the cell material and the channel material of the cell film 104a. In additional embodiments, the fill material 104a is omitted. The cell film 104a of the first pillar structures 104 may be operably associated with the source structure 116 underlying the preliminary stack structure 102.

The support structures 107, if present, may provide additional mechanical integrity and support to portions of the tiers 110 (FIGS. 1B and 1C) of insulating structures 106 and additional insulating structures 106 within the array region 120. In some embodiments, the support structures 107 are positioned within or proximate to regions of the preliminary stack structure 102 prone to tier collapse during subsequent processing acts (e.g., subsequent material removal acts). In some embodiments, the support structures 107 are positioned horizontally proximate to an area designated for the first pillar structures 104. In other embodiments, the support structures 107 are positioned horizontally proximate to the first trench regions 122 and the second trench region 124, in regions outside of boundaries of regions designed for one or more of the first pillar structures 104 and the second pillar structures 105. In some such embodiments, the microelectronic device structure 100 may include the support structures 107 between horizontally neighboring portions of the first trench regions 122 that are substantially absent (e.g., substantially devoid) of the first pillar structures 104 and the second pillar structures 105.

The support structures 107 may be formed in openings vertically extending through the tiers 110 of the preliminary stack structure 102. The support structures 107 may individually include a liner 107a, and a fill material 107b surrounded by the liner 107a. For each of the support structures 107, the liner 107a may be formed (e.g., conformally formed) within an opening formed in the preliminary stack structure 102. The liner 107a may be continuous along a vertical distance of the preliminary stack structure 102. The liner 107a may be formed of and include insulative material, such as a dielectric oxide material. For example, the material of the liner 107a may include a silicon oxide material (e.g., relatively high quality silicon oxide material, such as an ALD $SiO_x$). The material of the liner 107a may exhibit etch selectivity with respect to the additional insulating structures 108. The liner 107a may be formed by conventional techniques, such as by CVD or ALD. In some embodiments, the liner 107a is formed by plasma enhanced ALD (PEALD).

The fill material 107b of the support structures 107 may be formed adjacent (e.g., over) the liner 107a. In some embodiments, the fill material 107b is formed of and includes an insulative material, such as a silicon oxide material. In other embodiments, the fill material 107b is formed of and includes a conductive material including, but not limited to, n-doped polysilicon, p-doped polysilicon, undoped polysilicon, or a metal, such as tungsten. The liner 107a may substantially surround sidewalls of the fill material 107b. In some embodiments, such as where the fill material 107b comprises an insulative material, the support structures 107 may not include the liner 107a on sidewalls of the fill material 107b, and the support structures 107 may only include the fill material 107b (e.g., the insulative material).

The fill material 107b of the support structures 107 may be formed to substantially fill remaining portions of the openings extending vertically through the preliminary stack structure 102 and to the source tier 112. The support structures 107 may be proximate to one or more of the first trench regions 122 and the second trench region 124 and may be confined within the array region 120 of the microelectronic device structure 100. At least some of the support structures 107 may be formed to extend vertically from an upper surface of the preliminary stack structure 102 to an upper surface of the source structure 116 of the source tier 112. Alternatively or additionally, at least some of the support structures 107 (e.g., including the conductive material as the fill material 107b) may be formed to extend below the upper surface of source structure 116 into the source structure 116. In some embodiments, the support structures 107 are configured to provide one or more functions (e.g., electrical connections) in addition to support functions. In additional embodiments, the support structures 107 are configured to substantially only serve support functions. Upper surfaces of each of an uppermost one of the insulating structures 106 of the tiers 110 (e.g., the fourth tier 110d) of the preliminary stack structure 102, the first pillar structures 104, and the support structures 107 may be substantially coplanar with one another.

The support structures 107 may individually exhibit a substantially circular cross-sectional shape, as shown in the top-down view of FIG. 1A. However, the disclosure is not so limited. As a non-limiting example, in additional embodiments, the support structures 107 individually exhibit a substantially rectangular cross-sectional shape (e.g., a substantially square cross-sectional shape), or a different elongate cross-sectional shape (e.g., an oblong cross-sectional shape). A lateral dimension (e.g., a width, a diameter in a horizontal direction) of one or more of the support structures 107 may be relatively larger than a lateral dimension of one or more (e.g., each) of the first pillar structures 104 and the second pillar structures 105.

The microelectronic device structure 100 may further include a staircase region (e.g., an access line contact region) horizontally neighboring (e.g., in the X-direction) the array region 120. Features of the staircase region of the microelectronic device structure 100 may be formed during (e.g., substantially simultaneous with) formation of features of the array region 120. Additional components (e.g., features, structures, devices) may be located within boundaries of the different horizontal regions. For example, the first trench regions 122 and the second trench region 124 may be confined within the array region 120 (e.g., outside of boundaries of the staircase region). In some embodiments, the first trench regions 122 and the second trench region 124 are not formed in the staircase region. In other embodiments, at least some of the first trench regions 122 horizontally intervene (e.g., in the X-direction) between the array region 120 and the staircase region and at least portions of the second trench region 124 extend beyond a horizontal area of the array region 120.

Figure 2A:
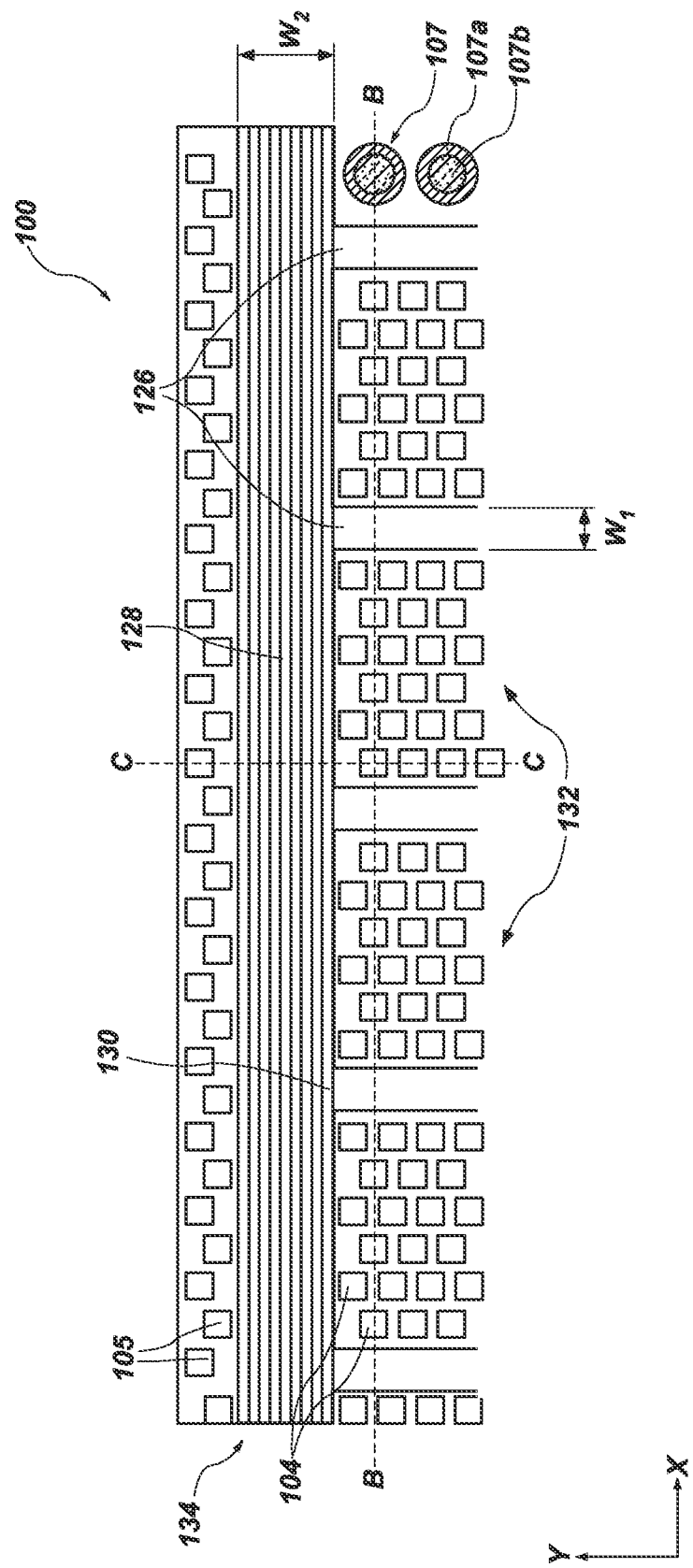
Figure 2B:
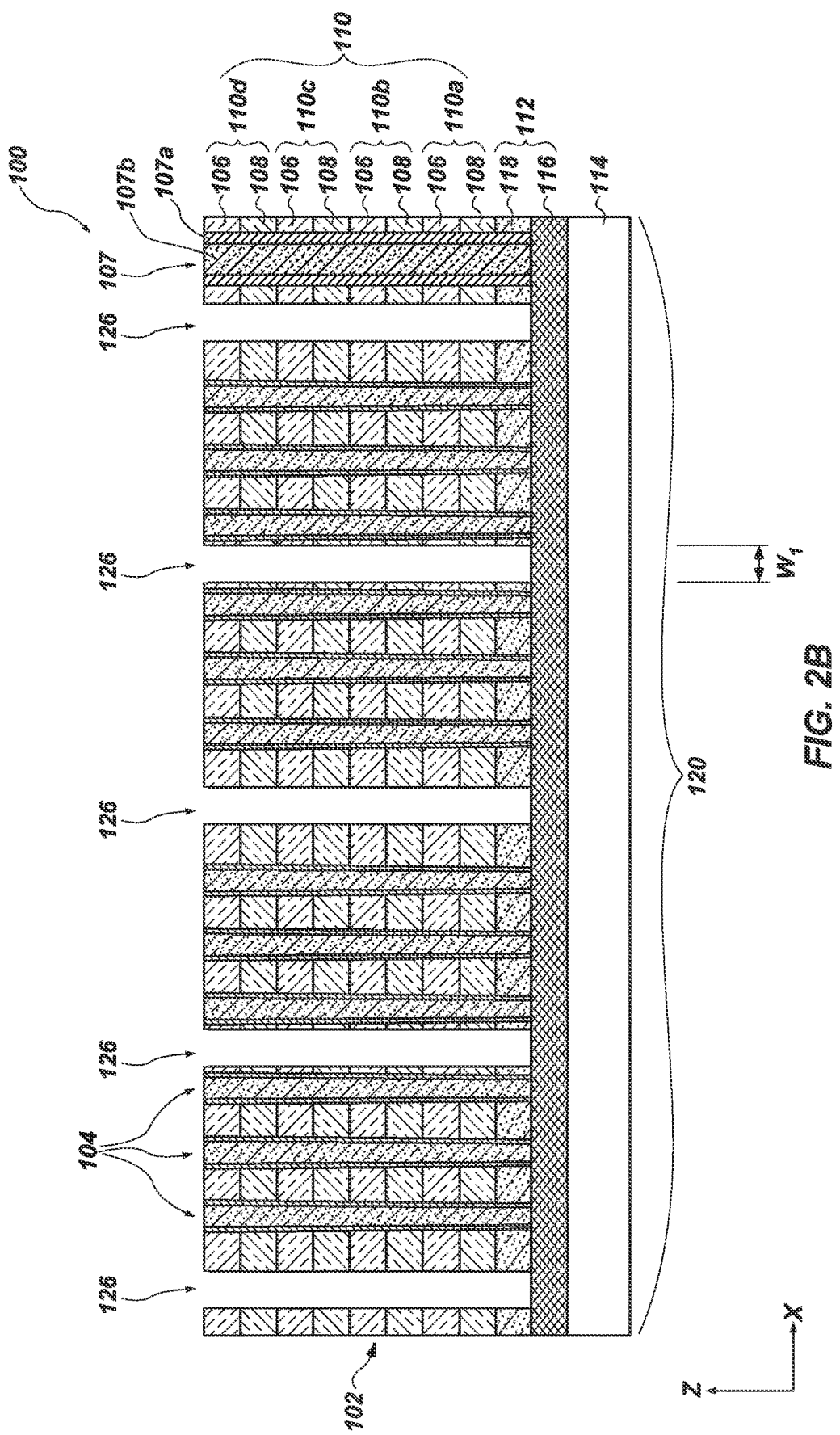
Figure 2C:
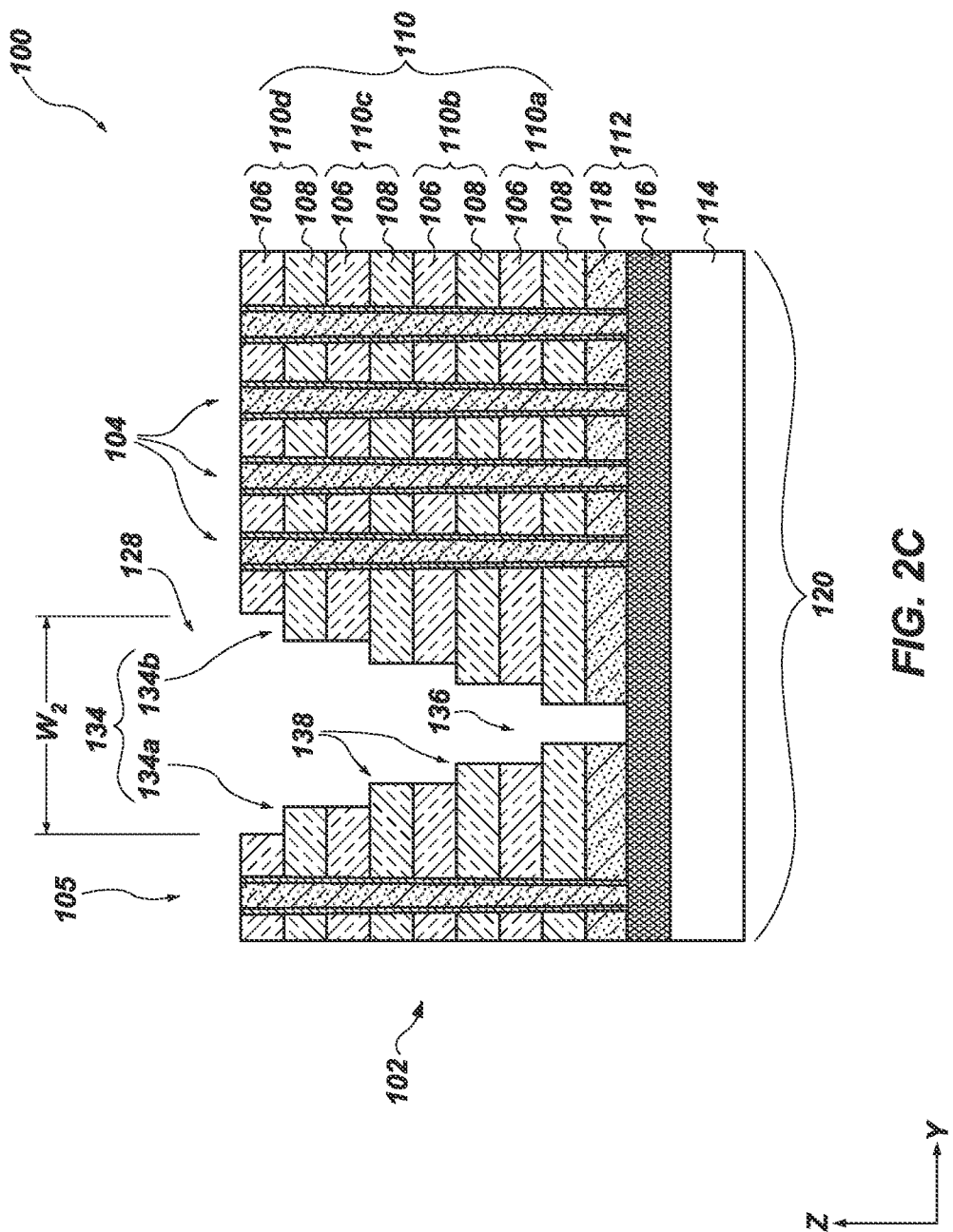

Referring next to FIG. 2A, first trenches 126 (e.g., slots, openings) and at least one second trench 128 (e.g., at least one additional slot, at least one additional opening) may be formed to vertically extend into the portions of the preliminary stack structure 102 (FIGS. 2B and 2C) within a horizontal area of the array region 120 (FIGS. 2B and 2C). The second trench 128 may extend in a first horizontal direction (e.g., the X-direction), and each of the first trenches 126 may extend in the second horizontal direction (e.g., the Y-direction) transverse to the first horizontal direction. The first trenches 126 may intersect the second trench 128 at intersections 130. FIGS. 2B and 2C are simplified, partial cross-sectional views of the microelectronic device structure 100 (about the line B-B and the line C-C, respectively) at the processing stage shown in FIG. 2A. For clarity and ease of understanding of the drawings and related description, not all features depicted in one of FIGS. 2A through 2C are depicted in each of the others of FIGS. 2A through 2C.

As shown in FIG. 2A, the first trenches 126 may be formed within the first trench regions 122 (FIG. 1A) and the second trench 128 may be formed within the at least one second trench region 124 (FIG. 1A). Each of the first trenches 126 and the second trench 128 may each be formed to vertically extend substantially completely through the preliminary stack structure 102. As shown in FIG. 2B, each of the first trenches 126 may vertically extend (e.g., in the Z-direction) from a vertically uppermost boundary of the preliminary stack structure 102 to a vertically uppermost boundary of the source structure 116 underlying the preliminary stack structure 102. In addition, the second trench 128 may vertically extend completely through the tiers 110 of the preliminary stack structure 102. While FIG. 2A illustrates a single (e.g., only one) second trench 128 within a single second trench region 124 proximate a perimeter (e.g., outer horizontal boundaries) of the preliminary stack structure 102, additional configurations may be contemplated. For example, the single second trench 128 may be centrally located within the preliminary stack structure 102 in the second horizontal direction (e.g., the Y-direction) and relatively remote from the perimeter of the preliminary stack structure 102. In additional embodiments, multiple (e.g., two or more) second trenches 128 may be formed horizontally proximate one another in the second horizontal direction, as described in further detail below with reference to FIG. 4A.

The first trenches 126 may individually have a first maximum width $W_1$ (e.g., a horizontal dimension) in the X-direction, and the second trench 128 may have a second maximum width $W_2$ (e.g., a horizontal dimension) in the Y-direction taken at a vertically uppermost boundary of the preliminary stack structure 102. In some embodiments, the second maximum width $W_2$ of the second trench 128 is relatively larger than the first maximum width $W_1$ of the first trenches 126. In additional embodiments, the second maximum width $W_2$ is substantially the same as (e.g., substantially equal to) the first maximum width $W_1$ or, alternatively, the second maximum width $W_2$ is relatively smaller than the first maximum width $W_1$. The relative widths of the trenches may be tailored to have a desired value that may be selected at least partially based on design requirements of the microelectronic device structure 100. By way of non-limiting example, the first maximum width $W_1$ of the first trenches 126, at locations external to the intersections 130, may be within a range from about 100 nm to about 400 nm, such as within a range from about 100 nm to about 200 nm, within a range from about 200 nm to about 300 nm, or within a range from about 300 nm to about 400 nm. The first maximum width $W_1$ of the first trenches 126, at locations external to the intersections 130, may be substantially uniform (e.g., constant, non-variable) across a vertical extent (e.g., height) of the preliminary stack structure 102. Sidewalls of the preliminary stack structure 102 defining the first trenches 126 may be substantially linear in the Z-direction.

In some embodiments, the second maximum width $W_2$ is selected to facilitate a desired horizontal distance between the second trench 128 and the first pillar structures 104, the second pillar structures 105, and the support structures 107; and to facilitate desired horizontal spacing (e.g., in the Y-direction) between the second pillar structure 105 and the first pillar structures 104 and the support structures 107. Further, the second maximum width $W_2$ of the second trench 128 may be selected to accommodate formation of a stadium structure 134, as described in further detail below. The second maximum width $W_2$ may, for example, be within a range of from about 1 percent to about 500 percent (e.g., from about 10 percent to about 250 percent, from about 25 percent to about 125 percent, from about 50 percent to about 100 percent) larger than the first maximum width $W_1$. The second maximum width $W_2$ may be between about 3 and 15 times (e.g., an order of magnitude) greater than the first maximum width $W_1$. By way of non-limiting example, the first maximum width $W_1$ may be within a range from about 200 nm to about 300 nm and the second maximum width $W_2$ may be within a range from about 500 nm (e.g., 0.5 micrometers (μm)) to about 2000 nm (e.g., 2 μm), although other configurations may be contemplated. For example, the second maximum width $W_2$ may be within a range from about 2 μm to about 4 μm, within a range from about 4 μm to about 6 μm, within a range from about 6 μm to about 8 μm, or even larger, depending on design requirements of the microelectronic device structure 100.

The second trench 128 may exhibit a stepped vertical cross-sectional shape. The stepped vertical cross-sectional shape of the second trench 128 may at least partially define a vertical cross-sectional shape of the stadium structure 134 (e.g., a staircase structure). In turn, the vertical cross-sectional shape of the stadium structure 134 be configured to inhibit (e.g., prevent) undesirable tier deformations (e.g., tier warping) and/or tier collapse so as to mitigate the risk of undesirable current leakage and short circuits. The configuration of the stadium structure 134 at least partially defined by the second trench 128 may provide increased structural support proximate perimeter of (or, alternatively, within) the array region 120, and/or at the intersections 130 of the first trenches 126 and the second trench 128, without undesirably increasing the overall width (e.g., horizontal footprint) of the array region 120. For example, the second trench 128, and the stadium structure 134 formed thereby, may effectively horizontally terminate different tiers 110 of the preliminary stack structure 102 at different horizontal positions than one another, to provide the preliminary stack structure 102 (and a stack structure subsequently formed therefrom) enhanced structural integrity than may otherwise be facilitated by trenches that would effectively terminate the different tiers 110 at substantially the same horizontal position.

The methods of the disclosure may reduce or eliminate process acts, such as the formation of complex configurations of the intersections 130, conventionally employed to form conventional microelectronic device structures having functions similar to the microelectronic device structure 100. The configuration of the stadium structure 134 at least partially defined by the second trench 128 may also facilitate a substantially even distribution of stresses with a subsequently formed stack structure. For example, the stadium structure 134 may reduce distortion (e.g., bowing, bending, warping, etc.) within the subsequently formed stack structure so as to substantially inhibit (e.g., impede, prevent) the occurrence of so-called "bowing" of the subsequently formed stack structure.

With returned reference to FIG. 2A, the first trenches 126 and the second trench 128 may divide the preliminary stack structure 102 into multiple blocks 132. The blocks 132 may each extend in substantially the same horizontal direction (e.g., the Y-direction) as one another, and neighboring blocks 132 may be horizontally separated (e.g., in the X-direction) from one another by the first trenches 126. Each of the blocks 132 may exhibit substantially the same geometric configuration (e.g., dimensions, shape) as each other of the blocks 132 the array. In addition, horizontally neighboring blocks 132 may all be horizontally separated from one another by substantially the same distance (e.g., corresponding to the first maximum width $W_1$ of the first trenches 126). Accordingly, the blocks 132 may be substantially uniformly (e.g., non-variably, equally, consistently) sized, shaped, and spaced relative to one another.

The intersections 130 may be defined as locations at which the second trench 128 extending in the first horizontal direction and the first trenches 126 extending in the second horizontal direction meet. The first trenches 126 and the second trench 128 may exhibit differing vertical cross-sectional shapes within or proximate to the intersections 130. For example, the first trenches 126 may include the substantially linear horizontal boundaries outside of horizontal areas of the intersections 130, while including a stepped horizontal boundaries within horizontal areas of the intersections 130, as shown in FIG. 2A. The stadium structure 134 may thus be substantially continuous between the blocks 132 in the first horizontal direction (e.g., the X-direction). In additional embodiments, the first trenches 126 may horizontally extend into and segment the stadium structure 134 at the intersections 130.

As shown in FIG. 2B, the first trenches 126 may comprise substantially linear, elongated openings having one end at the vertically uppermost boundary of a vertically uppermost tier 110 of the preliminary stack structure 102 and another end at an uppermost surface of the source structure 116. The first trenches 126 may individually be defined by substantially linear sidewalls of the materials (e.g., the insulating structures 106, the additional insulating structures 108) of the preliminary stack structure 102 at locations within or external to the intersections 130. The first trenches 126 may be formed in the preliminary stack structure 102 using conventional material removal (e.g., masking and etching) processes, which are not described in detail herein. For example, one or more portions of the preliminary stack structure 102 may be subjected to at least one etching process (e.g., at least one dry etching process, such as one or more of a reactive ion etching (RIE) process, a deep RIE process, a plasma etching process, a reactive ion beam etching process, and a chemically assisted ion beam etching process; at least one wet etching process, such as one or more of a hydrofluoric acid etching process, a buffered hydrofluoric acid etching process, and a buffered oxide etching process) to form the first trenches 126 in the preliminary stack structure 102.

As shown in FIG. 2C, one or more sidewalls of the materials of the preliminary stack structure 102 defining the second trench 128 and the stadium structure 134 may exhibit a stepped profile. The stadium structure 134 may, for example, include a stair step structure 134a, and an additional stair step structure 134b opposing the stair step structure 134a. A phantom line extending from a top of the stair step structure 134a to a bottom of the stair step structure 134a may exhibit the negative slope, and another phantom line extending from a top of the stair step structure 134b to a bottom of the stair step structure 134b may exhibit the positive slope. The stair step structure 134a and the additional stair step structure 134b may be separated from one another by a valley 136 (e.g., space, gap, trench, opening). The stair step structure 134a and the additional stair step structure 134b may each include steps 138 comprising edges (e.g., horizontal ends) of the tiers 110 of the preliminary stack structure 102. In some embodiments, the stair step structure 134a and the additional stair step structure 134b individually include a single (e.g., only one) step 138. In other embodiments, the stair step structure 134a and the additional stair step structure 134b individually include a multiple (e.g., more than one) steps 138. The stair step structure 134a and the additional stair step structure 134b of the structure 134 may each individually include a desired quantity of the steps 138, such as greater or equal to eight (8) of the steps 138, greater than or equal to sixteen (16) of the steps 138, greater or equal to than thirty-two (32) of the steps 138, greater than or equal to sixty-four (64) of the steps 138, greater than or equal to one-hundred and twenty-eight (128) of the steps 138, or greater than or equal to two-hundred and fifty-six (256) of the steps 138.

During formation of the steps 138 of the stair step structure 134a and the additional stair step structure 134b of the stadium structure 134, an initial stadium structure (e.g., configured substantially similar to the stadium structure 134) may be formed at an upper vertical position within the preliminary stack structure 102 of the microelectronic device structure 100 using conventional processes (e.g., conventional photolithographic patterning processes, conventional material removal processes), and conventional processing equipment, which are not described in detail herein. The microelectronic device structure 100 may then be subjected to one or more additional material removal processes (e.g., one or more chopping processes) to increase the depth(s) (e.g., in the Z-direction) of the initial stadium structure relative to an upper surface of the preliminary stack structure 102 and form the stadium structure 134, as shown in FIG. 2C. The stadium structure 134 may be substantially similar to the initial stadium structure used to form the stadium structure 134, except located at a relatively lower vertical position within the microelectronic device structure 100 (e.g., within the preliminary stack structure 102). The additional material removal processes may permit a lower boundary of the stadium structure 134 to be positioned at or below a lower boundary of the preliminary stack structure 102, such that the second trench 128 vertically overlying and at least partially defined by the stadium structure 134 vertically extends completely through the tiers 110 of the insulating structures 106 and the additional insulating structures 108, as shown in FIG. 2C.

In some embodiments, upper regions of the second trench 128 (e.g., corresponding to the upper vertical position of the initial stadium structure within the preliminary stack structure 102) include substantially linear, elongated openings vertically overlying the steps 138 of the stadium structure 134. In some such embodiments, the second trench 128 is vertically extended into the preliminary stack structure 102 using at least one material removal process (e.g., at least one chopping process) to terminate vertically below a location of the initial stadium structure and form the stadium structure 134. In additional embodiments, each of the tiers 110 of the preliminary stack structure 102 include a one or more steps 138 of the stadium structure 134 therein, and substantially linear, elongated openings are not formed above the stadium structure 134.

In additional embodiments, the stadium structure 134 exhibits a different configuration than that depicted in FIG. 2C. As a non-limiting example, the stadium structure 134 may be modified to include the stair step structure 134a but not the additional stair step structure 134b (e.g., the additional stair step structure 134b may be absent), or the stadium structure 134 may be modified to include the additional stair step structure 134b but not the stair step structure 134a (e.g., the stair step structure 134a may be absent). As shown in FIG. 2C, in some embodiments, the stair step structure 134a mirrors the additional stair step structure 134b. The stair step structure 134a and the additional stair step structure 134b may exhibit the same quantity of steps 138 as one another, and corresponding steps 138 of the stair step structure 134a and the additional stair step structure 134b may be positioned at substantially the same vertical elevations as one another. In additional embodiments, the stair step structure 134a does not mirror the additional stair step structure 134b. The stair step structure 134a and the additional stair step structure 134b may exhibit different quantities of steps 138 than one another, and/or vertical elevations of steps 138 of the stair step structure 134a may be at least partially different than vertical elevations of steps 138 of the additional stair step structure 134b. In addition, each of the steps 138 of the stadium structure 134 (e.g., each of the steps 138 of the stair step structure 134a, each of the steps 138 of the additional stair step structure 134b) may exhibit substantially the same horizontal width in the Y-direction, or one or more of the steps 138 of the stadium structure 134 may exhibit a different horizontal width in the Y-direction than one or more other of the steps 138 of the stadium structure 134.

Figure 3A:
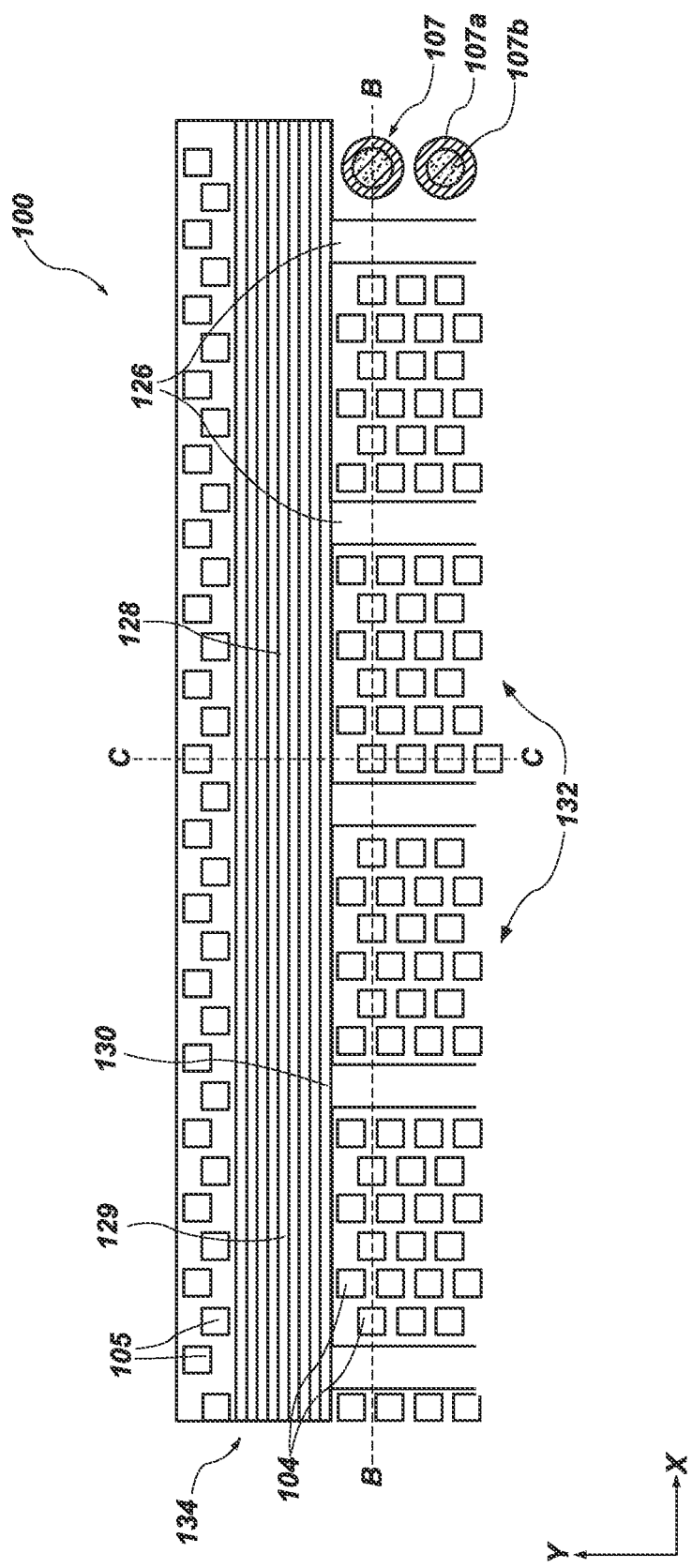
Figure 3B:
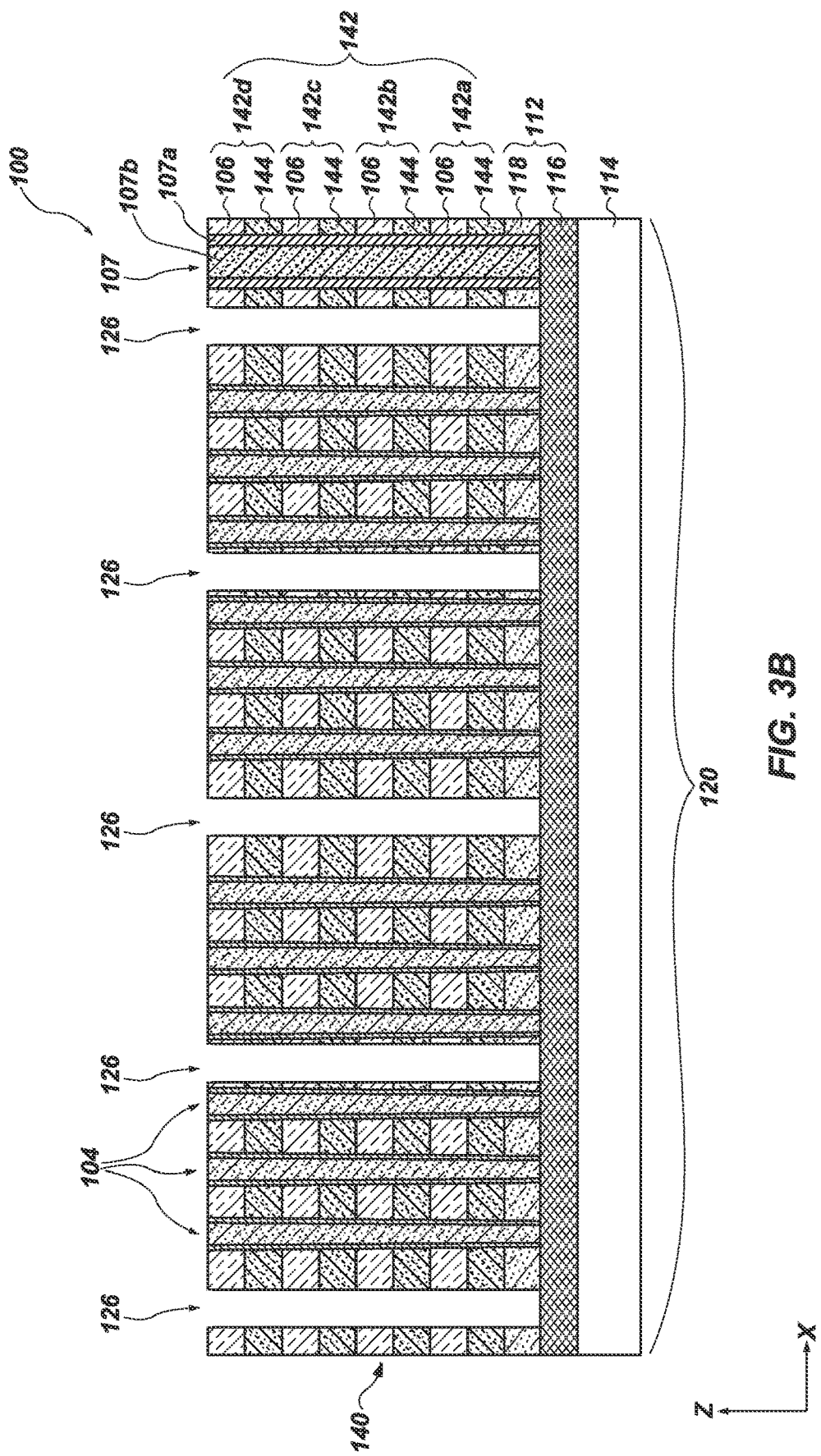
Figure 3C:
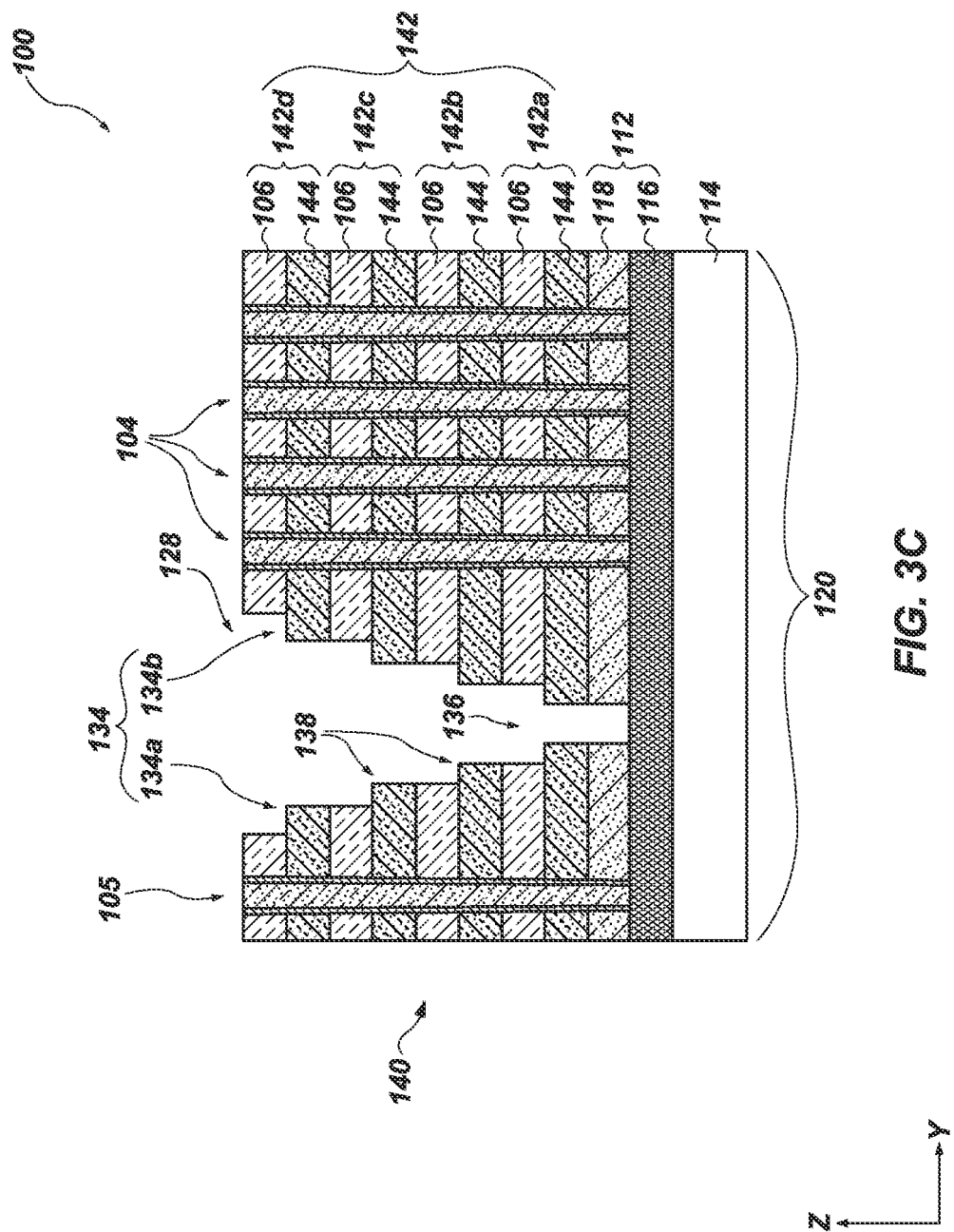

Referring next to FIG. 3A, the microelectronic device structure 100 at the processing stage depicted in FIGS. 2A through 2C may be subjected to a "replacement gate" or "gate last" process to convert the preliminary stack structure 102 (FIGS. 2B and 2C) into a stack structure 140 (FIGS. 3B and 3C). FIGS. 3B and 3C are simplified, partial cross-sectional views of the microelectronic device structure 100 (about the line B-B and the line C-C, respectively) at the processing stage shown in FIG. 3A. For clarity and ease of understanding of the drawings and related description, not all features depicted in one of FIGS. 3A through 3C are depicted in the other of FIGS. 3A through 3C.

Referring to FIGS. 3B and 3C, the replacement gate process may include selectively removing one or more portions of the additional insulating structures 108 (FIGS. 2B and 2C) of the tiers 110 (FIGS. 2B and 2C) of the preliminary stack structure 102 (FIGS. 2B and 2C) exposed by the first trenches 126 and the second trench 128, and then filling spaces previously occupied by the portions of the additional insulating structures 108 with at least one conductive material to form conductive structures 144. As shown in FIGS. 3B and 3C, the stack structure 140 may be formed to include a vertically alternating (e.g., in the Z-direction) sequence of the insulating structures 106 and the conductive structures 144 arranged in tiers 142. A quantity of the tiers 142 in the stack structure 140 may correspond to (e.g., be the same as) the quantity of the tiers 110 included in the preliminary stack structure 102. Each of the tiers 142 of the stack structure 140 may include at least one insulating structure 106 and at least one conductive structure 144 vertically adjacent the insulating structure 106. During the formation of the conductive structures 144, the configuration of the stadium structure 134 underlying the second trench 128 may inhibit (e.g., prevent) the undesirable tier deformations (e.g., tier warping) and/or tier collapse by reducing an offset margin of the first pillar structures 104 relative to the first trenches 126 and the second trench 128.

With returned reference to FIGS. 3B and 3C, the conductive structures 144 of the stack structure 140 may be formed of and include at least one conductive material. In some embodiments, the conductive structures 144 are formed of and include tungsten (W). In other embodiments, the conductive structures 144 are formed of and include conductively doped polysilicon. Each of the conductive structures 144 may individually include a substantially homogeneous distribution of the at least one conductive material, or a substantially heterogeneous distribution of the at least one conductive material. In some embodiments, each of the conductive structures 144 exhibits a substantially homogeneous distribution of conductive material. In additional embodiments, at least one of the conductive structures 144 exhibits a substantially heterogeneous distribution of at least one conductive material.

The conductive structures 144 of one or more vertically upper tiers 142 (e.g., a fourth tier 142d, a third tier 142c) of the stack structure 140 may be employed as select gate structures (e.g., drain side select gate (SGD) structures) for the blocks 132 of the stack structure 140. In addition, the conductive structures 144 of one or more vertically lower tiers 142 (e.g., a first tier 142a) of the stack structure 140 may be employed as additional select gate structures (e.g., source side select gate (SGS) structures) for the blocks 132 of the stack structure 140. The conductive structures 144 of one or more remaining tiers 142 (e.g., a second tier 142b) of the stack structure 140 may be employed as access line (e.g., word line) structures (e.g., access line plates, word line plates) for the blocks 132 of the stack structure 140.

The additional insulating structures 108 (FIGS. 2B and 2C) of the tiers 110 (FIGS. 2B and 2C) of the preliminary stack structure 102 (FIGS. 2B and 2C) may be selectively removed by subjecting the preliminary stack structure 102 to at least one etching process (e.g., an isotropic etching process) employing an etch chemistry in which the additional insulative material of the additional insulating structures 108 is selectively removed relative to the insulative material of the insulating structures 106. By way of non-limiting example, if the insulating structures 106 are formed of and include $SiO_2$, and the additional insulating structures 108 are formed of and include $Si_3N_4$, the preliminary stack structure 102 may be exposed to an etchant comprising phosphoric acid ($H_3PO_4$) to selectively remove one or more portions of the additional insulating structures 108 adjacent side surfaces the blocks 132 exposed by the first trenches 126 and the second trench 128. Thereafter, the conductive material may be formed (e.g., delivered, deposited) within void spaces resulting from the selective removal of the additional insulative material of the additional insulating structures 108 to form the conductive structures 144.

Figure 4A:
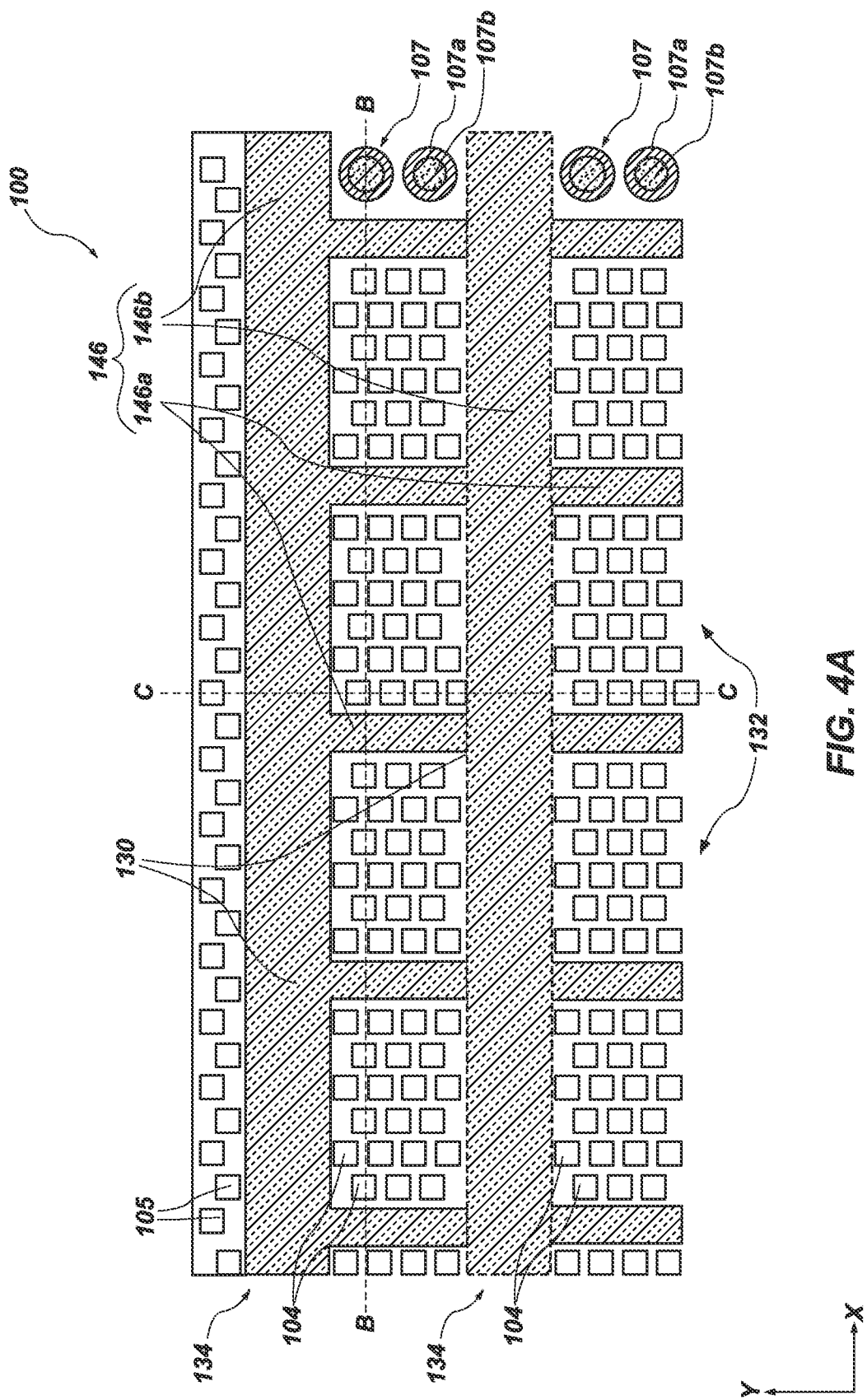
Figure 4B:
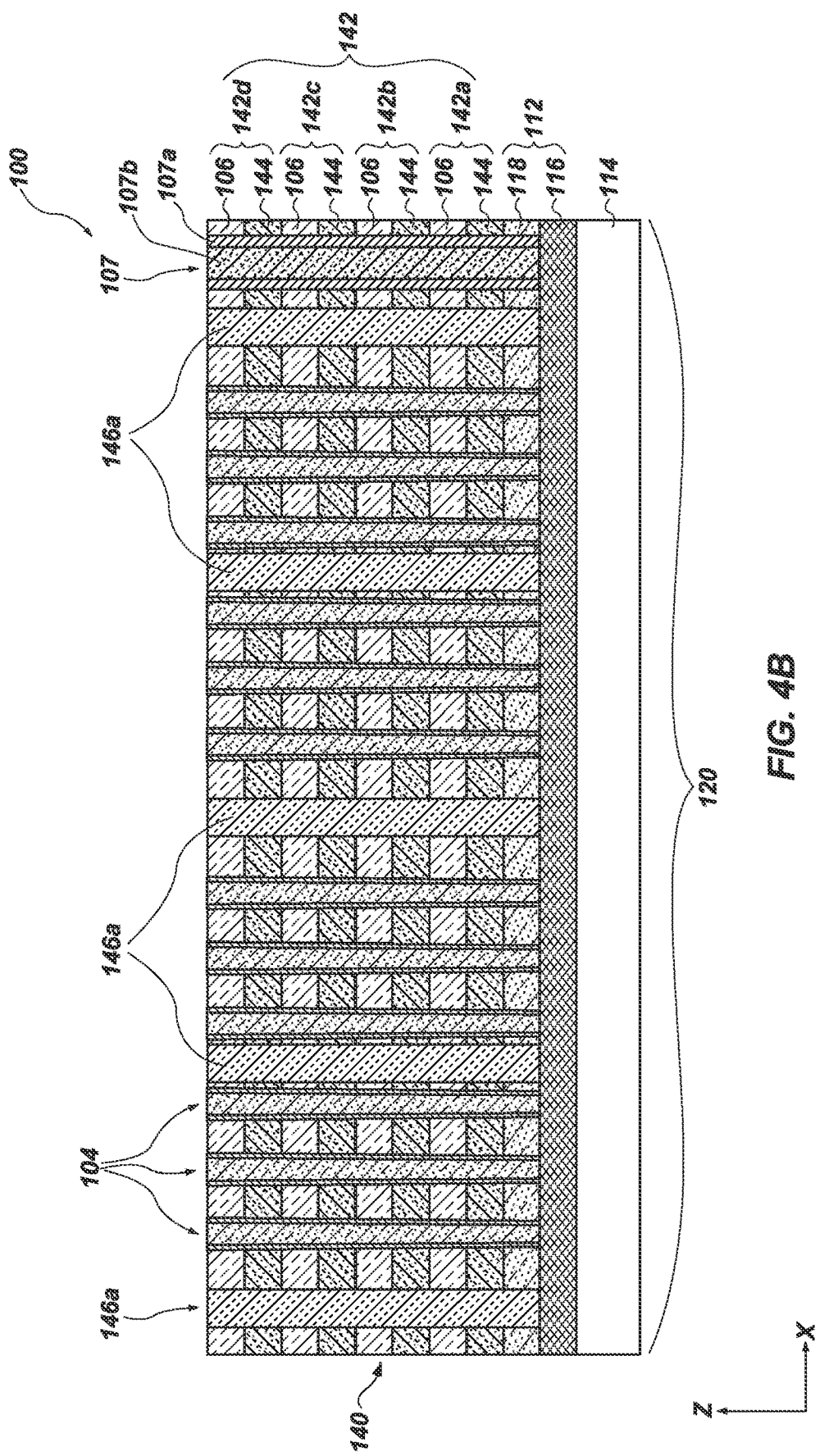
Figure 4C:
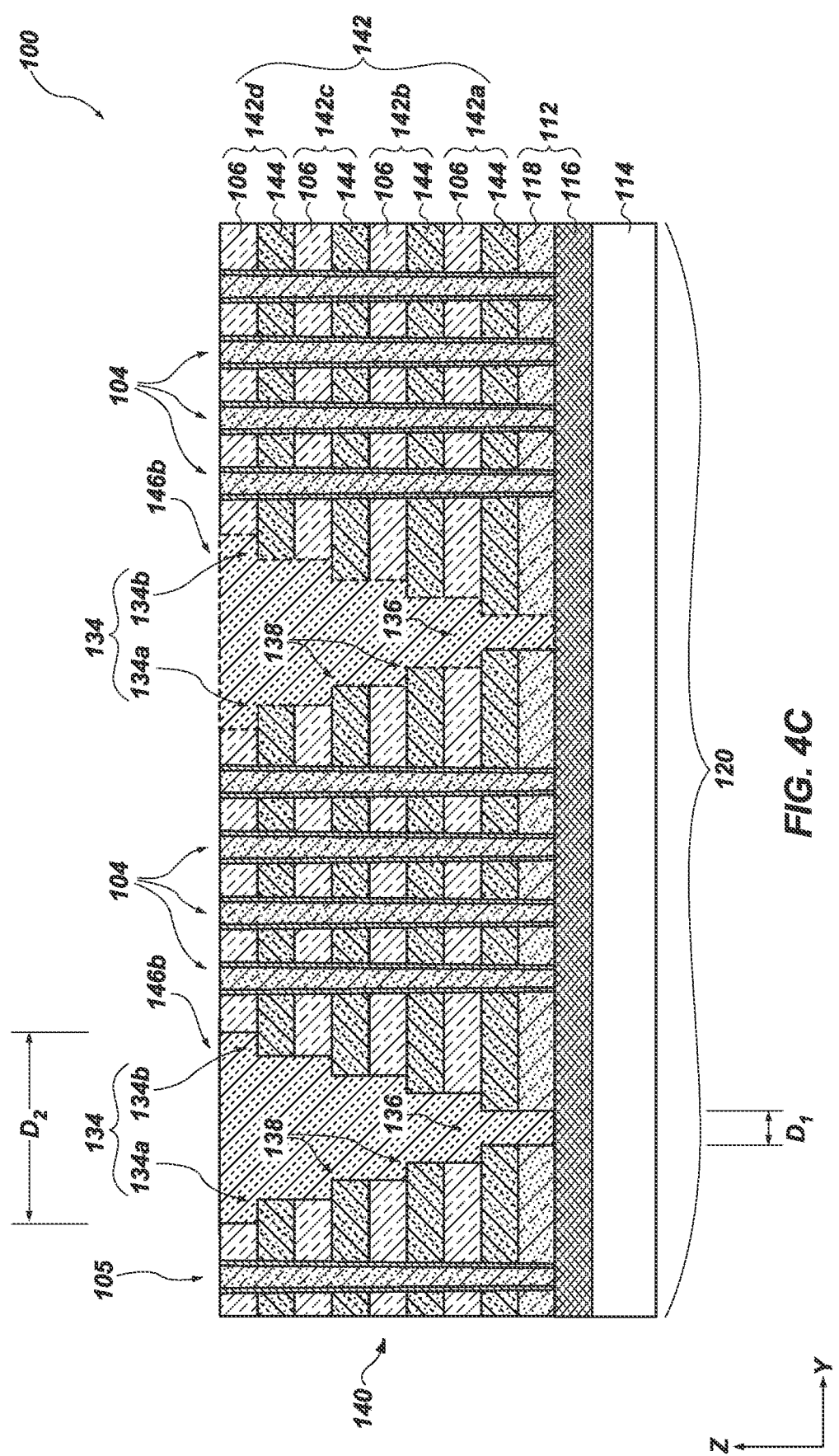

Referring next to FIG. 4A, a dielectric material 146 may be formed within the first trenches 126 and the second trench 128. The dielectric material 146 may at least partially (e.g., substantially) fill the first trenches 126 and the second trench 128. FIGS. 4B and 4C are simplified, partial cross-sectional views of the microelectronic device structure 100 (about the line B-B and the line C-C, respectively) at the processing stage shown in FIG. 4A. For clarity and ease of understanding of the drawings and related description, not all features depicted in one of FIGS. 4A through 4C are depicted in the other of FIGS. 4A through 4C.

The dielectric material 146 may be formed of and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$) at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the dielectric material 146 may substantially the same as a material composition of the insulating structures 106 of the stack structure 140, or the material composition of the dielectric material 146 may be different than the material composition of the insulating structures 106. In some embodiments, the dielectric material 146 is formed of and includes $SiO_2$. The dielectric material 146 may include a substantially homogeneous distribution or a substantially heterogeneous distribution of the at least one insulative material thereof. In some embodiments, the dielectric material 146 exhibits a substantially homogeneous distribution of the insulative material thereof. In further embodiments, the dielectric material 146 exhibits a substantially heterogeneous distribution of insulative material thereof.

While FIGS. 1A through 3C illustrate the formation of a single (e.g., only one) second trench 128 proximate a perimeter of the preliminary stack structure 102, additional configurations are contemplated. For example, the single second trench 128 may be formed to be relatively more horizontally centered within the preliminary stack structure 102 in the second horizontal direction (e.g., the Y-direction), and, hence, relatively more horizontally remote from the perimeter of the preliminary stack structure 102. In additional embodiments, multiple (e.g., two or more) of the second trenches 128 are formed horizontally adjacent one another in the second horizontal direction. Accordingly, multiple second trenches 128 (FIG. 3C), multiple stadium structures 134, and additional portions of the dielectric material 146 filling the multiple second trenches 128 (FIG. 3C) may be formed, as shown in FIGS. 4A and 4C, wherein the additional stadium structures 134 and the additional portions of the dielectric material 146 are depicted by way of dashed lines.

As shown in FIG. 4A, the dielectric material 146 may include first portions 146a at least partially (e.g., substantially completely) filling the first trenches 126 (FIG. 3A), and second portions 146b at least partially (e.g., substantially completely) filling the second trench 128 (FIG. 3A). The first portions 146a of the dielectric material 146 may extend in the second horizontal direction (e.g., the Y-direction), and the second portions 146b of the dielectric material 146 may intersect the first portions 146a of the dielectric material 146 at the intersections 130 and may extend in the first horizontal direction (e.g., the X-direction) orthogonal to the second horizontal direction. The first portions 146a of the dielectric material 146 may horizontally intervene (e.g., in the X-direction) between the horizontally neighboring blocks 132 of the first pillar structures 104. The second portions 146b of the dielectric material 146 may be integral with the first portions 146a of the dielectric material 146, and may continuously extend (e.g., in the X-direction) from and between the first portions 146a of the dielectric material 146. According, the first portions 146a and the second portions 146b of the dielectric material 146 at least partially (e.g., substantially) fill the intersections 130. In some embodiments, a minimum distance between the first pillar structures 104 and the dielectric material 146 is within a range of from about 50 nm to about 200 nm, such as from about 50 nm to about 100 nm, from about 100 nm to about 150 nm, or from about 150 nm to about 200 nm.

As shown in FIG. 4B, each of the first portions 146a of the dielectric material 146 may vertically extend completely through the stack structure 140. For example, each of the first portions 146a of the dielectric material 146 may vertically extend (e.g., in the Z-direction) from a vertically uppermost boundary of a vertically uppermost tier 142 (e.g., the fourth tier 142d) of the stack structure 140 to a vertically uppermost boundary of the source structure 116 underlying the stack structure 140. In addition, the second portions 146b of the dielectric material 146 may vertically extend completely through the tiers 142 of the stack structure 140, as shown in FIG. 4C. Since portions the first trenches 126 (FIG. 3B) outside of horizontal areas of the intersections 130 may be defined by substantially linear sidewalls in the Z-direction of the preliminary stack structure 102 (FIG. 3B), the first portions 146a of the dielectric material 146 may include substantially linear sidewalls in contact (e.g., direct contact) and coincident with the substantially linear sidewalls of the stack structure 140 (e.g., including the substantially linear sidewalls of the insulating structures 106 and the conductive structures 144 thereof). In addition, since the second trench 128 (FIG. 3C) may include the stepped vertical cross-sectional shape, the second portions 146b of the dielectric material 146 may also include a stepped vertical cross-sectional shape in contact (e.g., direct contact) and coincident with a stepped vertical cross-sectional shape of the stadium structure 134. Further, the substantially linear sidewalls of at least some of the first portions 146a of the dielectric material 146 may extend at least partially into the stadium structure 134 of the second portions 146b thereof within the intersections 130.

The dielectric material 146 may be formed using conventional processes (e.g., conventional deposition processes) and conventional processing equipment, which are not described in detail herein. For example, the first portions 146a of the dielectric material 146 may be formed within the first trenches 126 (FIG. 2A) and the second portions 146b thereof may be formed within the second trench 128 (FIG. 2A) using one or more conventional material deposition processes (e.g., a conventional CVD process, a conventional ALD process).

As shown in FIG. 4C, the conductive structures 144 at a vertically lowermost tier 142 (e.g., the first tier 142a) of the stack structure 140 are separated from one another, by lower sections of the second portions 146b of the dielectric material 146, by a first distance $D_1$ in the Y-direction. In addition, the conductive structures 144 at a vertically uppermost tier 142 (e.g., the fourth tier 142d) are separated from one another, by upper sections of the second portions 146b of the dielectric material 146, by a second distance $D_2$ in the Y-direction. The second distance $D_2$ is greater than the first distance $D_1$. In other words, the conductive structures 144 of the vertically lowermost tier 142 may exhibit a width in the Y-direction that is relatively greater than a width of the conductive structures 144 of the vertically uppermost conductive tier 142 within individual blocks 132 (FIG. 4A) of the stack structure 140. By way of non-limiting example, the first distance $D_1$ may be within a range from about 100 nm to about 400 nm, such as within a range from about 100 nm to about 200 nm, within a range from about 200 nm to about 300 nm, or within a range from about 300 nm to about 400 nm; and the second distance $D_2$ may be within a range from about 500 nm (e.g., 0.5 μm) to about 2000 nm (e.g., 2 μm), such as within a range from about 500 nm to about 1000 nm, within a range from about 1000 nm to about 1500 nm, or within a range from about 1500 nm to about 2000 nm, although other configurations may be contemplated. For example, the second distance $D_2$ may be within a range from about 2 μm to about 4 μm, within a range from about 4 μm to about 6 μm, within a range from about 6 μm to about 8 μm, or even larger, depending on design requirements of the microelectronic device structure 100.

As shown in FIG. 4C, in some embodiments, the stadium structure 134 is substantially free of conductive contact structures formed on the steps 138 thereof (e.g., on the steps 138 of the stair step structure 134a and the additional stair step structure 134b of the stadium structure 134). In additional embodiments, one or more conductive contact structures (e.g., conductive contacts, live contacts) are formed within openings in the second portions 146b of the dielectric material 146 to physically and electrically contact the at least some of the conductive structures 144 at least partially defining the steps of the stadium structure 134 to access lines coupled to logic circuitry (e.g., string drive circuitry) within the base structure 114. Further, support structures (e.g., the support structures 107) may, optionally, be formed to extend vertically through the second portions 146b of the dielectric material 146 and portions of the stack structure 140 within a horizontal area of the stadium structure 134. If present, such support structures may be sized, shaped, positioned, and spaced to provide structural support to the preliminary stack structure 102 (FIGS. 2B and 2C) during the "replacement gate" processing acts performed on the microelectronic device structure 100. Following the formation of the dielectric material 146, the microelectronic device structure 100 may be subjected to additional processing.

One of ordinary skill in the art will appreciate that, in accordance with additional embodiments of the disclosure, the features and feature configurations described above in relation to FIGS. 1A through 4C may be adapted to design needs of different microelectronic devices (e.g., different memory devices). By way of non-limiting example, in accordance with additional embodiments of the disclosure, FIGS. 5A through 8C are simplified, partial top-down views (i.e., FIGS. 5A, 6A, 7A, and 8A) and simplified, partial cross-sectional view (i.e., FIGS. 5B, 5C, 6B, 6C, 7B, 7C, 8B, and 8C) of a method of forming a microelectronic device structure having a different configuration than the microelectronic device structure 100. Throughout the remaining description and the accompanying figures, functionally similar features (e.g., structures, devices) are referred to with similar reference numerals. To avoid repetition, not all features shown in the remaining figures (including FIGS. 5A through 8C) are described in detail herein. Rather, unless described otherwise below, a feature designated by a reference numeral of a previously described feature (whether the previously described feature is first described before the present paragraph, or is first described after the present paragraph) will be understood to be substantially similar to the previously described feature.

Figure 5A:
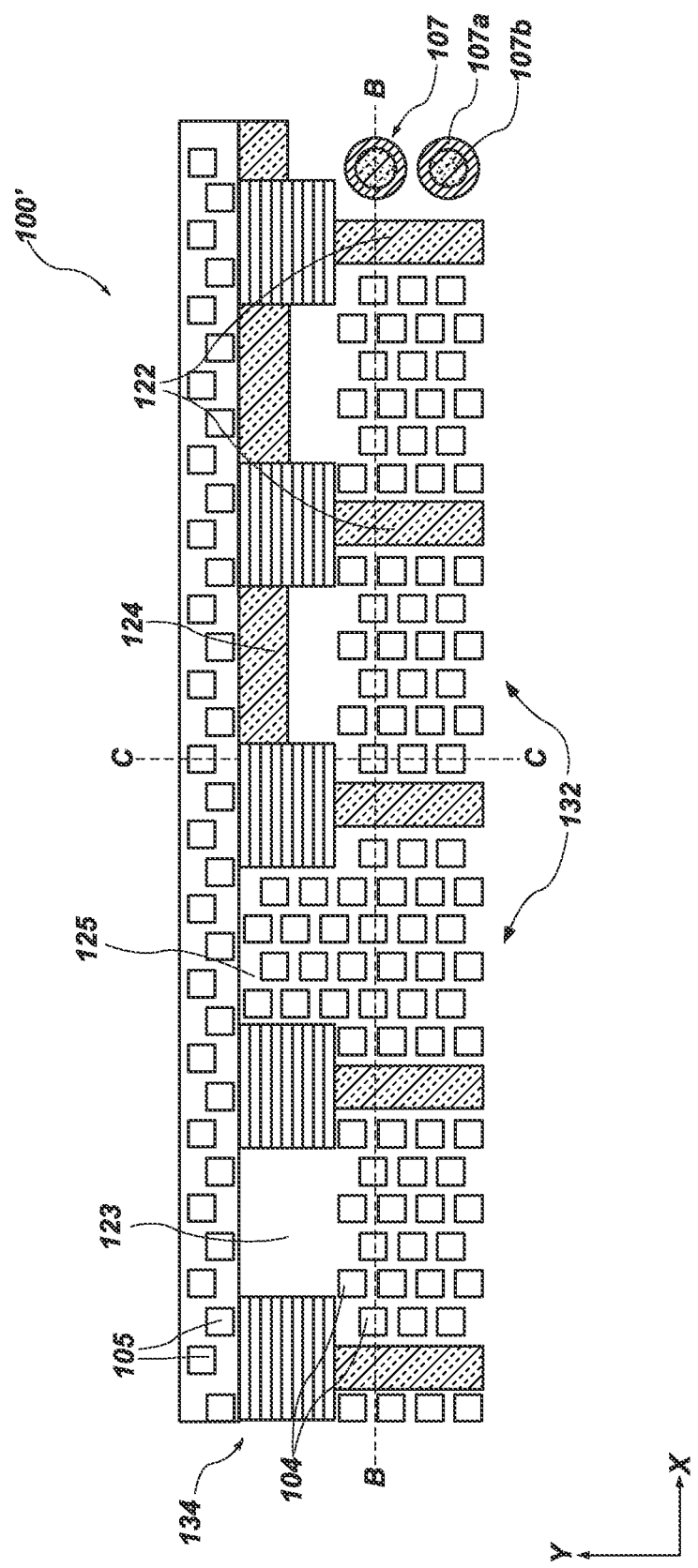
FIGS. 5A through 8C are simplified, partial top-down views (i.e., FIGS. 5A, 6A, 7A, and 8A) and simplified, partial cross-sectional views (i.e., FIGS. 5B, 5C, 6B, 6C, 7B, 7C, 8B, and 8C) illustrating a method of forming a microelectronic device, in accordance with additional embodiments of the disclosure.
Figure 5B:
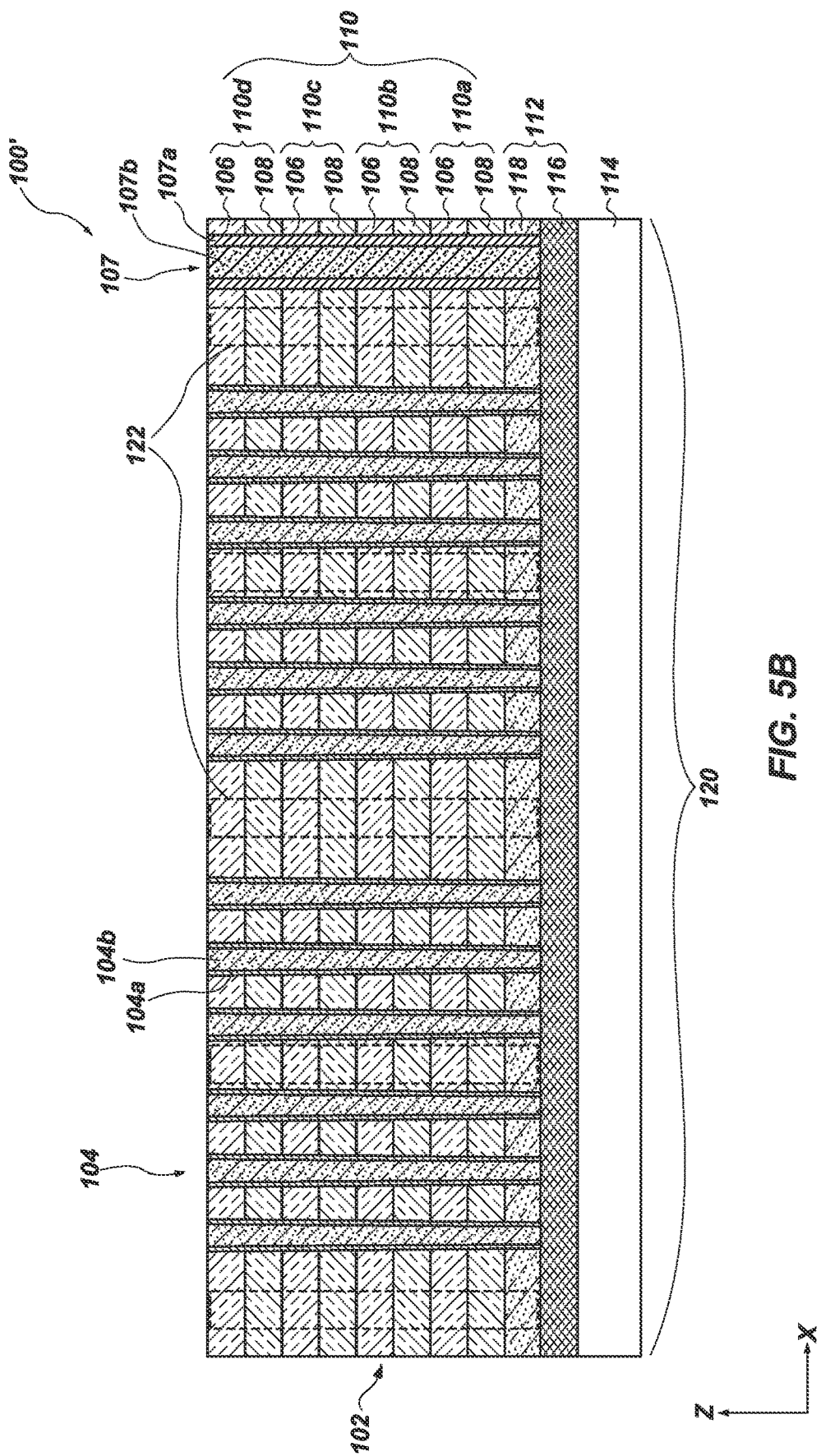
Figure 5C:
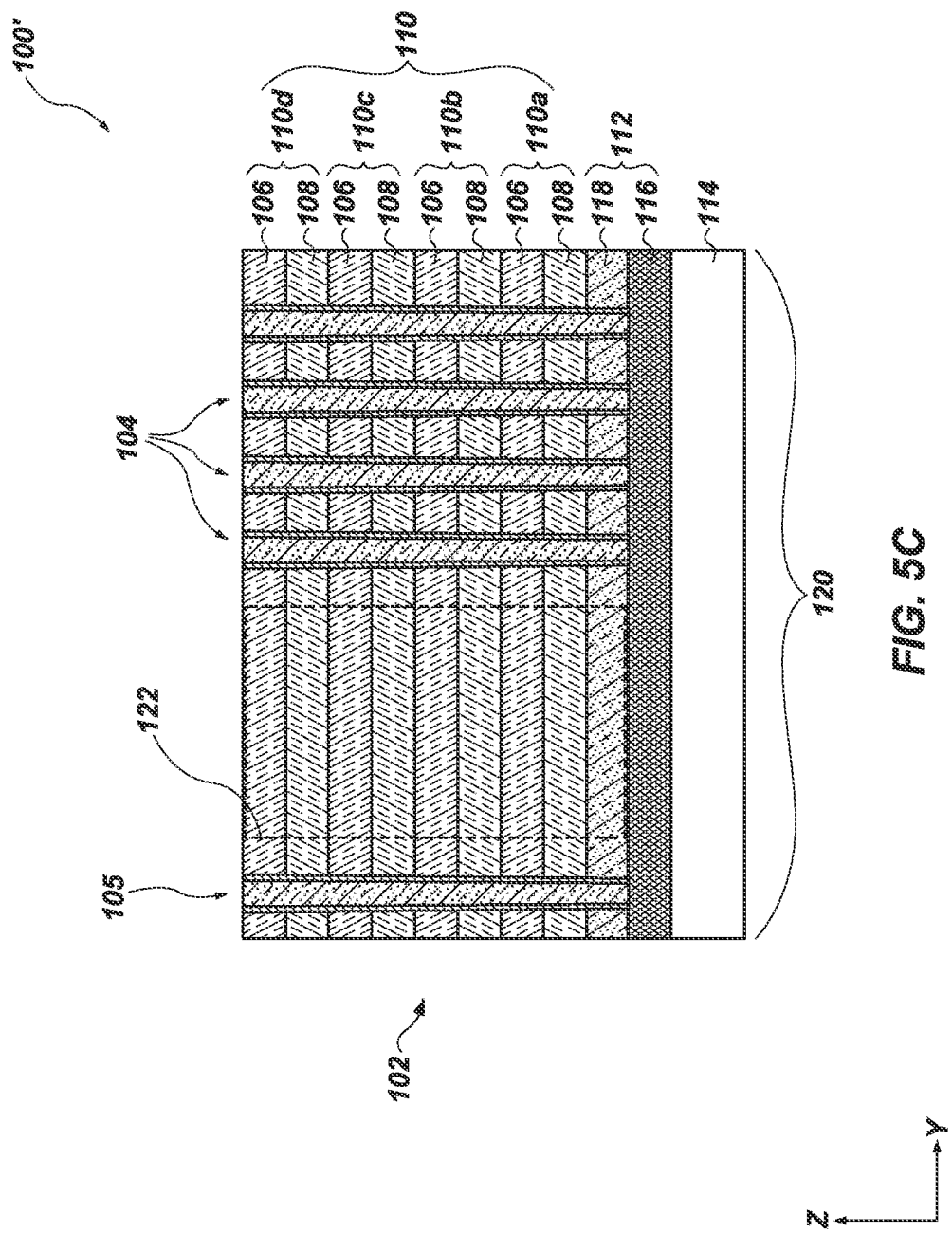

FIG. 5A illustrates a simplified, partial top-down view of a microelectronic device structure 100'. At the processing stage depicted in FIG. 5A, the microelectronic device structure 100' may be substantially similar to the microelectronic device structure 100 at the processing stage depicted in FIG. 1A. FIG. 5B is a simplified, partial cross-sectional view of the microelectronic device structure 100' about the line B-B shown in FIG. 5A. FIG. 5C is a simplified, partial cross-sectional view of the microelectronic device structure 100' about the line C-C shown in FIG. 5A. For clarity and ease of understanding of the drawings and related description, not all features depicted in one of FIGS. 5A through 5C are depicted in each of the others of FIGS. 5A through 5C.

Referring collectively to FIGS. 5A through 5C, the microelectronic device structure 100' FIGS. 5A through 5C includes the preliminary stack structure 102 (FIGS. 5B and 5C), the first pillar structures 104, the second pillar structures 105, and, optionally, the support structures 107 extending vertically through the preliminary stack structure 102. The preliminary stack structure 102 of the microelectronic device structure 100' may also be formed to include the vertically alternating (e.g., in the Z-direction) sequence of the insulating structures 106 and the additional insulating structures 108 arranged in the tiers 110 (e.g., the tiers 110a-110d). The microelectronic device structure 100' may be formed to include the source tier 112 vertically under the preliminary stack structure 102 and the at least one base structure 114 vertically under the source tier 112. The source tier 112 may include the at least one source structure 116 and the at least one other insulating structure 118 vertically adjacent the source structure 116.

The first pillar structures 104 may be separated from the second pillar structures 105 by the at least one second trench region 124 extending in the first horizontal direction (e.g., in the X-direction), and neighboring blocks 132 each including one or more of the first pillar structures 104 and the support structures 107 may be horizontally separated from one another by the first trench regions 122 extending in the second horizontal direction (e.g., in the Y-direction) within the array region 120, as in processing stage of the embodiment of the disclosure previously described with reference to FIGS. 1A through 1C. However, as collectively shown in FIGS. 5A through 5C, configurations of the first trench regions 122 and the second trench region 124 may be modified relative to the configurations thereof previously described with reference to FIGS. 1A through 1C to spatially accommodate subsequently formed features (e.g., trenches including stadium structures), as described in further detail below. For example, the first trench regions 122 of the microelectronic device structure 100', as shown in FIG. 5A, may include at least one relatively wider portion exhibiting a width in the X-direction that is relatively greater than a width in the first horizontal direction of the first trench regions 122 of the microelectronic device structure 100, as shown in FIG. 1A.

Figure 6A:
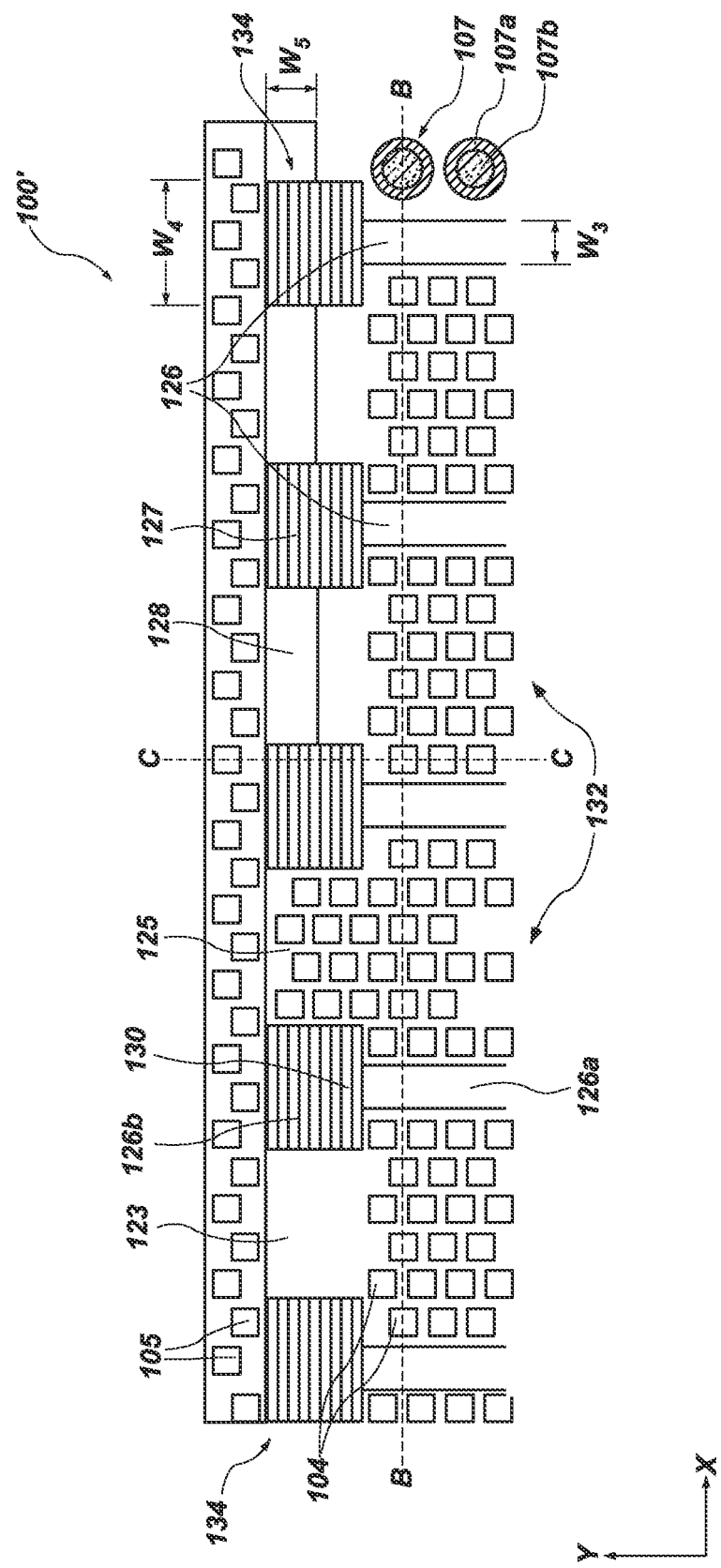
Figure 6B:
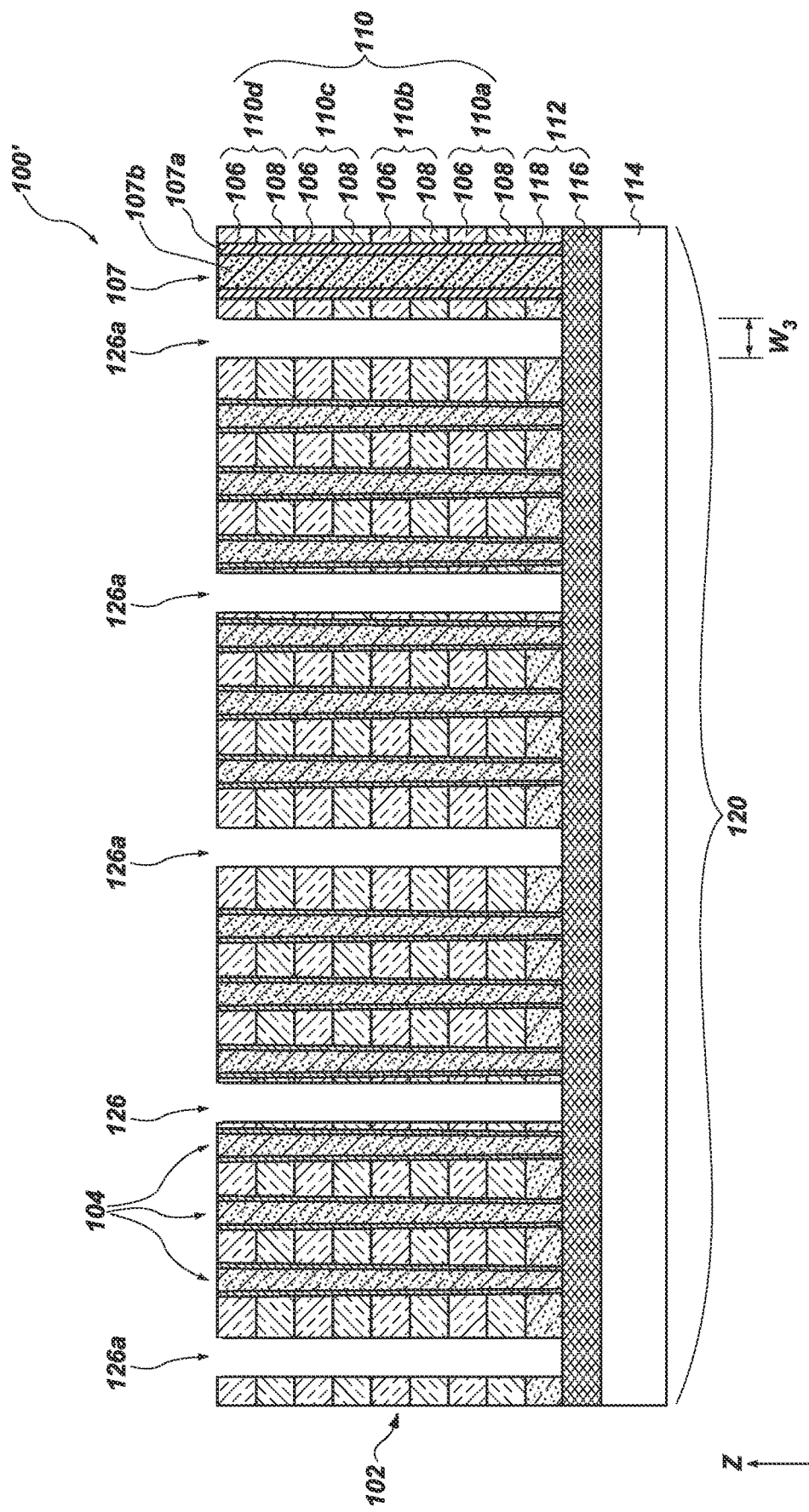
Figure 6C:
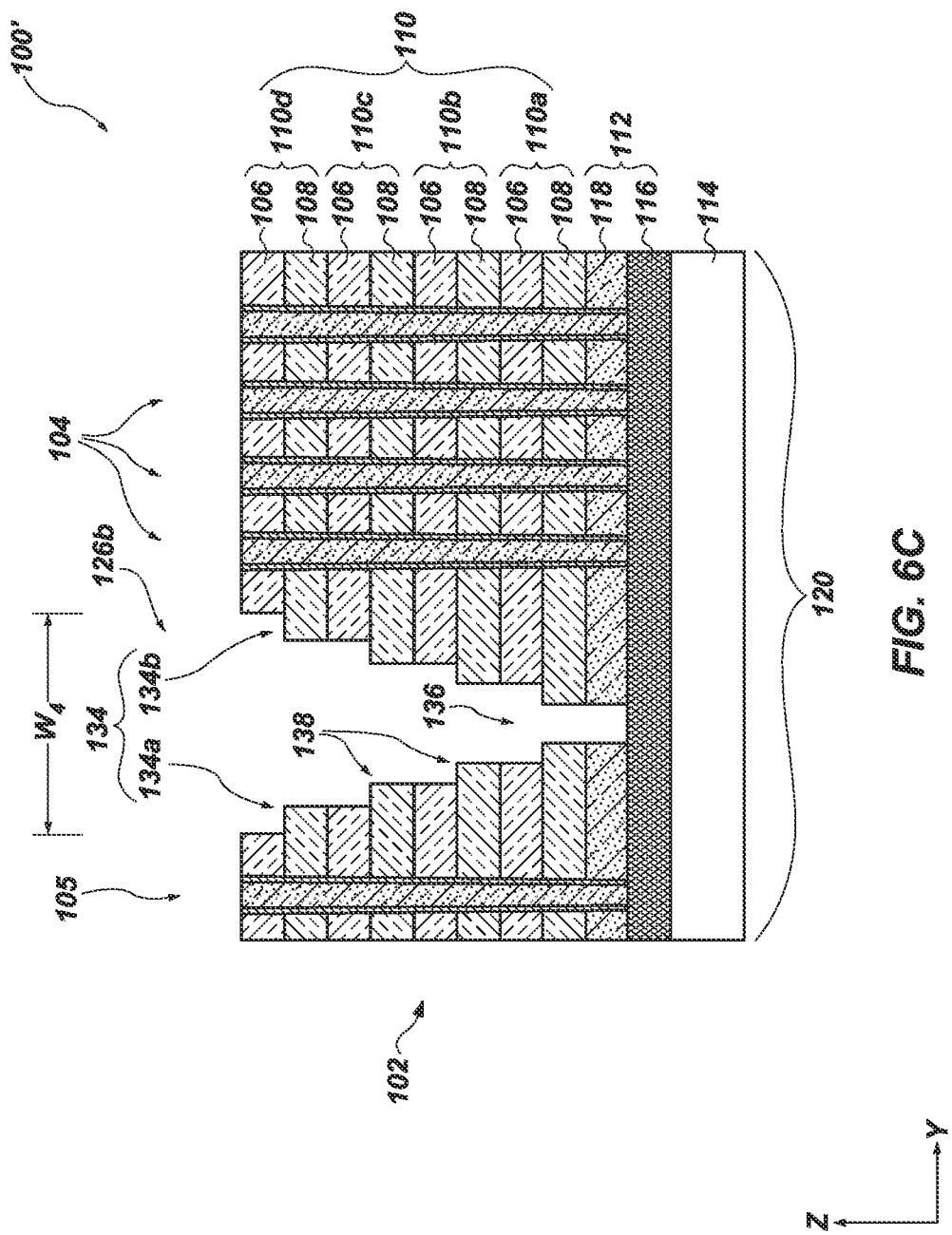

Referring next to FIG. 6A, the first trenches 126 and the at least one second trench 128 may be formed to vertically extend into the preliminary stack structure 102 (FIGS. 6B and 6C) within the array region 120 (FIGS. 6B and 6C). The first trenches 126 intersect the second trench 128 at the intersections 130. The stadium structure 134 of the microelectronic device structure 100', as shown in FIG. 6A, may include discrete (e.g., discontinuous) structures in the first horizontal direction that may or may not be segmented by portions of the second trench 128, which configuration differs from a substantially continuous structure of the stadium structure 134 of the microelectronic device structure 100, as shown in FIG. 2A. FIGS. 6B and 6C are simplified, partial cross-sectional views of the microelectronic device structure 100' (about the line B-B and the line C-C, respectively) at the processing stage shown in FIG. 6A. For clarity and ease of understanding of the drawings and related description, not all features depicted in one of FIGS. 6A through 6C are depicted in each of the others of FIGS. 6A through 6C.

As shown in FIG. 6A, the first trenches 126 may be formed within the first trench regions 122 (FIG. 5A) and the second trench 128 may be formed within the at least one second trench region 124 (FIG. 5A). At least some (e.g., each) of the first trenches 126 of the additional embodiments of the disclosure described herein with reference to FIGS. 6A through 8C may include a relatively narrower portion 126a, and a relatively wider portion 126b disposed at a horizontal end in the Y-direction of the relatively narrower portion 126a. The first trenches 126 (including the relatively narrower portions 126a and the relatively wider portions 126b thereof), and the second trench 128 may each be formed to vertically extend substantially completely through the preliminary stack structure 102. As shown in FIG. 6B, each of the relatively narrower portions 126a of the first trenches 126 may vertically extend in the Z-direction from a vertically uppermost boundary of the preliminary stack structure 102 to or below a vertically lowermost boundary of the preliminary stack structure 102.

With continued reference to FIG. 6A, the relatively narrower portion 126a of each of the first trenches 126 may have a third width $W_3$ in the X-direction, and the relatively wider portion 126b of each of the first trenches 126 may have a fourth width $W_4$ in the X-direction larger than the third width $W_3$ of the relatively narrower portion 126a. The second trench 128 (e.g., at locations external to the intersections 130) may have a fifth width $W_5$ in the Y-direction. The third width $W_3$ of the relatively narrower portion 126a of each of the first trenches 126 may be substantially the same as (e.g., substantially equal to) the fifth width $W_5$ of the second trench 128, or the third width $W_3$ may be different than (e.g., not equal to) the fifth width $W_5$. By way of non-limiting example, each of the third width $W_3$ of the relatively narrower portion 126a of each of the first trenches 126 and the fifth width $W_5$ of the second trench 128, at locations external to the intersections 130, may each be within a range from about 100 nm to about 400 nm, such as within a range from about 100 nm to about 200 nm, within a range from about 200 nm to about 300 nm, or within a range from about 300 nm to about 400 nm. The fourth width $W_4$ may, for example, be within a range of from about 1 percent to about 500 percent (e.g., from about 10 percent to about 250 percent, from about 25 percent to about 125 percent, from about 50 percent to about 100 percent) larger than each of the third width $W_3$ and the fifth width $W_5$. In particular, the fourth width $W_4$ may be between about 3 and 15 times (e.g., an order of magnitude) greater than each of the third width $W_3$ and the fifth width $W_5$. By way of non-limiting example, each of the third width $W_3$ and the fifth width $W_5$ may be within a range from about 200 nm to about 300 nm and the fourth width $W_4$ may be within a range from about 500 nm (e.g., 0.5 µm) to about 2000 nm (e.g., 2 µm), although other configurations may be contemplated. For example, the fourth width $W_4$ may be within a range from about 2 µm to about 4 µm, within a range from about 4 µm to about 6 µm, within a range from about 6 µm to about 8 µm, or even larger, depending on design requirements of the microelectronic device structure 100. In some embodiments, the fourth width $W_4$ is selected to facilitate a desired horizontal distance between the relatively wider portion 126b of the first trenches 126 and the neighboring blocks 132 and a horizontal spacing (e.g., in the X-direction) between neighboring blocks 132.

The relatively wider portion 126b of each of the first trenches 126 may exhibit a different configuration (e.g., size and shape) than the relatively narrower portion 126a of each of the first trenches 126. For example, the relatively narrower portion 126a of each first trench 126, at locations external to the intersections 130, may exhibit a rectangular prism shape having a substantially rectangular horizontal cross-sectional shape extending in the Y-direction. The relatively wider portion 126b of at least some of first trenches 126 may also exhibit a rectangular prism shape having another substantially rectangular horizontal cross-sectional shape extending in the Y-direction. The fourth width $W_4$ of the relatively wider portion 126b of the first trenches 126 may spatially accommodate formation of the stadium structures 134 therein.

The relatively wider portion 126b of at least some (e.g., each) of the first trenches 126 may exhibit a stepped vertical cross-sectional shape. The stepped vertical cross-sectional shape of the first trenches 126 may at least partially define a vertical cross-sectional shape of the stadium structure 134. In turn, the vertical cross-sectional shape of the stadium structure 134 be configured to inhibit (e.g., prevent) undesirable tier deformations (e.g., tier warping) and/or tier collapse so as to mitigate the risk of undesirable current leakage and short circuits. The configuration of the stadium structure 134 at least partially defined by the relatively wider portion 126b of the first trenches 126 may provide increased structural support proximate perimeter of (or, alternatively, within) the array region 120, and/or at the intersections 130 of the first trenches 126 and the second trench 128, without undesirably increasing the overall width (e.g., horizontal footprint) of the array region 120. For example, the first trenches 126, and the stadium structure 134 formed thereby, may effectively horizontally terminate different tiers 110 of the preliminary stack structure 102 at different horizontal positions than one another, to provide the preliminary stack structure 102 (and a stack structure subsequently formed therefrom) enhanced structural integrity than may otherwise be facilitated by trenches that would effectively terminate the different tiers 110 at substantially the same horizontal position. The stadium structure 134 may be formed within a horizontal area of the array region 120, as well as within non-array regions of the microelectronic device structure 100.

The methods of the disclosure may reduce or eliminate process acts, such as the formation of complex configurations of the intersections 130, conventionally employed to form conventional microelectronic device structures having functions similar to the microelectronic device structure 100. The configuration of the stadium structure 134 at least partially defined by the relatively wider portion 126b of the first trenches 126 may also facilitate a substantially even distribution of stresses with a subsequently formed stack structure. For example, the stadium structure 134 may reduce distortion (e.g., bowing, bending, warping, etc.) within the subsequently formed stack structure so as to substantially inhibit (e.g., impede, prevent) the occurrence of so-called "bowing" of the subsequently formed stack structure.

With returned reference to FIG. 6A, since the first trenches 126 and the second trench 128 divide the preliminary stack structure 102 into multiple blocks 132, neighboring blocks 132 may be horizontally separated in the X-direction from one another by the relatively narrower portions 126a of the first trenches 126, as well as the stadium structures 134 located within the horizontal areas of relatively wider portions 126b of the first trenches 126. In some embodiments, the stadium structures 134 are interposed between (e.g., are flanked by) the first pillar structures 104, as shown in FIGS. 6A and 6C. In other embodiments, at least some of the first trenches 126 are formed around a perimeter (e.g., outer horizontal boundaries) of the array region 120.

As shown in FIG. 6A, each of the relatively wider portions 126b of the first trenches 126 and the second trench 128 may exhibit differing vertical cross-sections shapes within or proximate the intersections 130. For example, each of the relatively narrower portions 126a of the first trenches 126 and the second trench 128 may comprise the substantially linear, elongated openings having one end at the vertically uppermost boundary of a vertically uppermost tier 110 of the preliminary stack structure 102 and another end at an uppermost surface of the source structure 116, while the relatively wider portion 126b of the first trenches 126 includes a stepped pattern of the stadium structure 134 within the intersections 130, as shown in FIG. 6A. Alternatively, the substantially linear, elongated openings of at least some of the relatively narrower portion 126a of the first trenches 126 and the second trench 128 may extend at least partially into the stadium structure 134 underlying the relatively wider portion 126b of the first trenches 126 within the intersections 130.

Further, the second trench 128 may not be formed to extend between each of the segmented portions of the stadium structure 134. For example, isolation regions 123 (e.g., non-trench regions, non-pillar regions) may extend between at least some of the segmented portions of the stadium structure 134, as shown in FIG. 6A. Accordingly, remaining portions of the materials (e.g., the insulating structures 106, the additional insulating structures 108) of the preliminary stack structure 102 may extend between the segmented portions of the stadium structure 134 within the isolation regions 123, without forming portions of the second trench 128 therein and without forming pillar structures or support structures therein. In other words, the second trench 128 may not be formed within the isolation regions 123, such that the materials of the preliminary stack structure 102 remain intact between the segmented portions of the stadium structure 134 to provide additional structural support to the tiers 110 of the preliminary stack structure 102.

In other embodiments, additional pillar regions 125 (e.g., additional non-trench regions) extend between at least some of the segmented portions of the stadium structure 134, as shown in FIG. 6A. The first pillar structures 104, for example, may be formed to extend between the segmented portions of the stadium structure 134 within the additional pillar regions 125, without forming portions of the second trench 128 therein. Alternatively, or additionally, one or more of the second pillar structures 105 and the support structures 107 may be formed within the additional pillar regions 125. In other words, the second trench 128 may not be formed within the additional pillar regions 125, such that pillar and/or support structures extend vertically through the materials of the preliminary stack structure 102 between the segmented portions of the stadium structure 134 to provide additional structural support to the tiers 110 of the preliminary stack structure 102. One of ordinary skill in the art will appreciate that one or more of the second trench 128, the isolation regions 123, and the additional pillar regions 125 may be selectively positioned to achieve the desired performance objectives for structural support in regions between the segmented portions of the stadium structure 134. Accordingly, segmented portions of the stadium structure 134 may be discontinuous and discrete from one another in the X-direction. For example, one or more of the second trench 128 and the materials (e.g., the insulating structures 106, the additional insulating structures 108) of the preliminary stack structure 102 laterally intervene (e.g., in the first horizontal direction) between the segmented portions of the stadium structure 134. Accordingly, the stadium structure 134 may be considered to be formed of and include multiple, relatively smaller stadium structures separated from one another by intervening portions of one or more of the preliminary stack structure 102, the second trench 128, the isolation regions 123, and the additional pillar regions 125.

As shown in FIG. 6B, the relatively narrower portion 126a of each of the first trenches 126 may be located external to the intersections 130 and may individually be defined by substantially linear sidewalls of the materials (e.g., the insulating structures 106, the additional insulating structures 108) of the preliminary stack structure 102.

As shown in FIG. 6C, one or more sidewalls of the materials of the preliminary stack structure 102 defining the relatively wider portion 126b of each of the first trenches 126 and the stadium structure 134 may exhibit a stepped profile. The stadium structure 134 may include the stair step structure 134a and the additional stair step structure 134b separated from one another by the valley 136. The stair step structure 134a and the additional stair step structure 134b may each include the steps 138 comprising edges (e.g., horizontal ends) of the tiers 110 of the preliminary stack structure 102. In some embodiments, the stair step structure 134a and the additional stair step structure 134b individually include a single (e.g., only one) step 138. In other embodiments, the stair step structure 134a and the additional stair step structure 134b individually include a multiple (e.g., more than one) steps 138. The stair step structure 134a and the additional stair step structure 134b of the structure 134 may each individually include a desired quantity of the steps 138, such as greater or equal to eight (8) of the steps 138, greater than or equal to sixteen (16) of the steps 138, greater or equal to than thirty-two (32) of the steps 138, greater than or equal to sixty-four (64) of the steps 138, greater than or equal to one-hundred and twenty-eight (128) of the steps 138, or greater than or equal to two-hundred and fifty-six (256) of the steps 138.

As in the previous embodiment, the stadium structure 134 may be modified to include the stair step structure 134a but not the additional stair step structure 134b (e.g., the additional stair step structure 134b may be absent), or the stadium structure 134 may be modified to include the additional stair step structure 134b but not the stair step structure 134a (e.g., the stair step structure 134a may be absent). As shown in FIG. 6C, in some embodiments, the stair step structure 134a mirrors the additional stair step structure 134b. The stair step structure 134a and the additional stair step structure 134b may exhibit the same quantity of steps 138 as one another, and corresponding steps 138 of the stair step structure 134a and the additional stair step structure 134b may be positioned at substantially the same vertical elevations as one another. In additional embodiments, the stair step structure 134a does not mirror the additional stair step structure 134b. The stair step structure 134a and the additional stair step structure 134b may exhibit different quantities of steps 138 than one another, and/or vertical elevations of steps 138 of the stair step structure 134a may be at least partially different than vertical elevations of steps 138 of the additional stair step structure 134b.

Figure 7A:
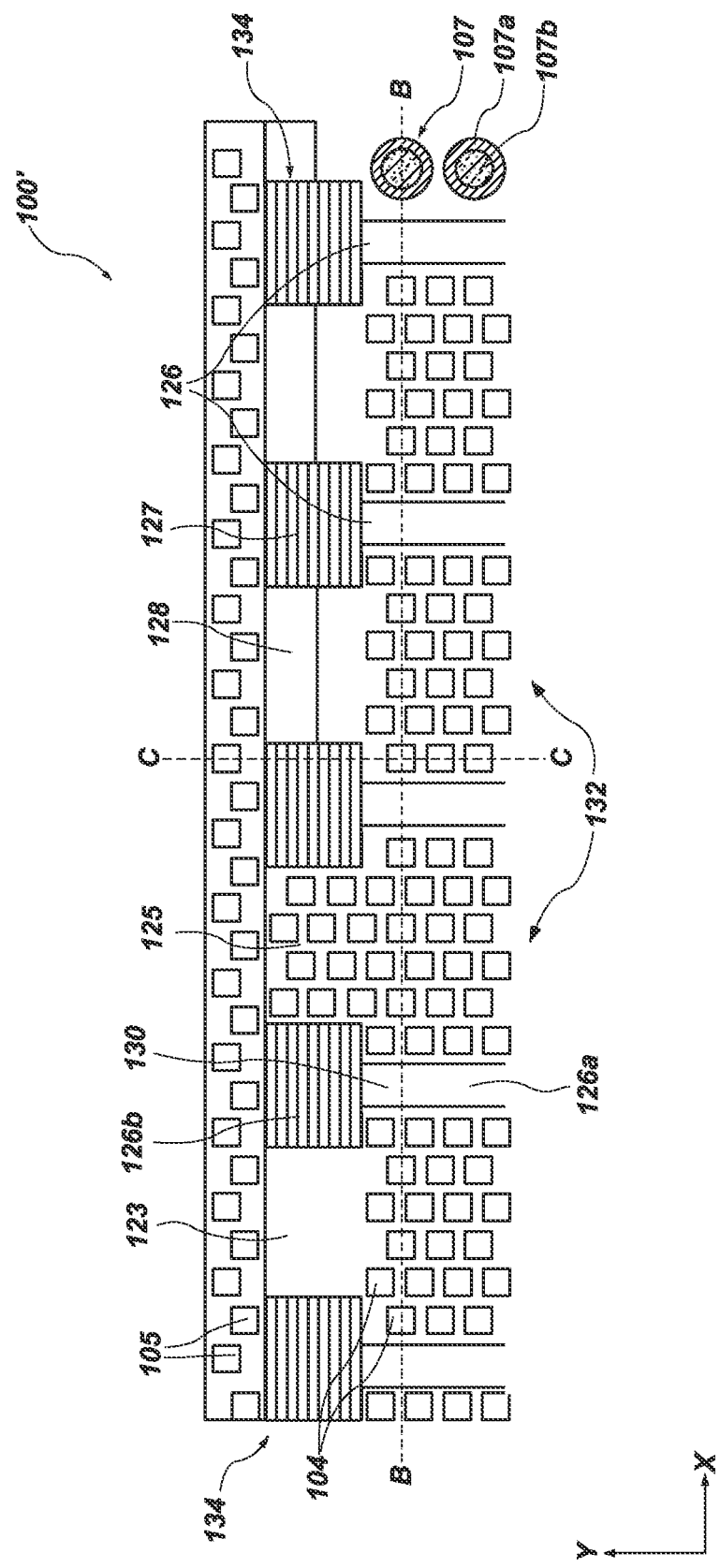
Figure 7B:
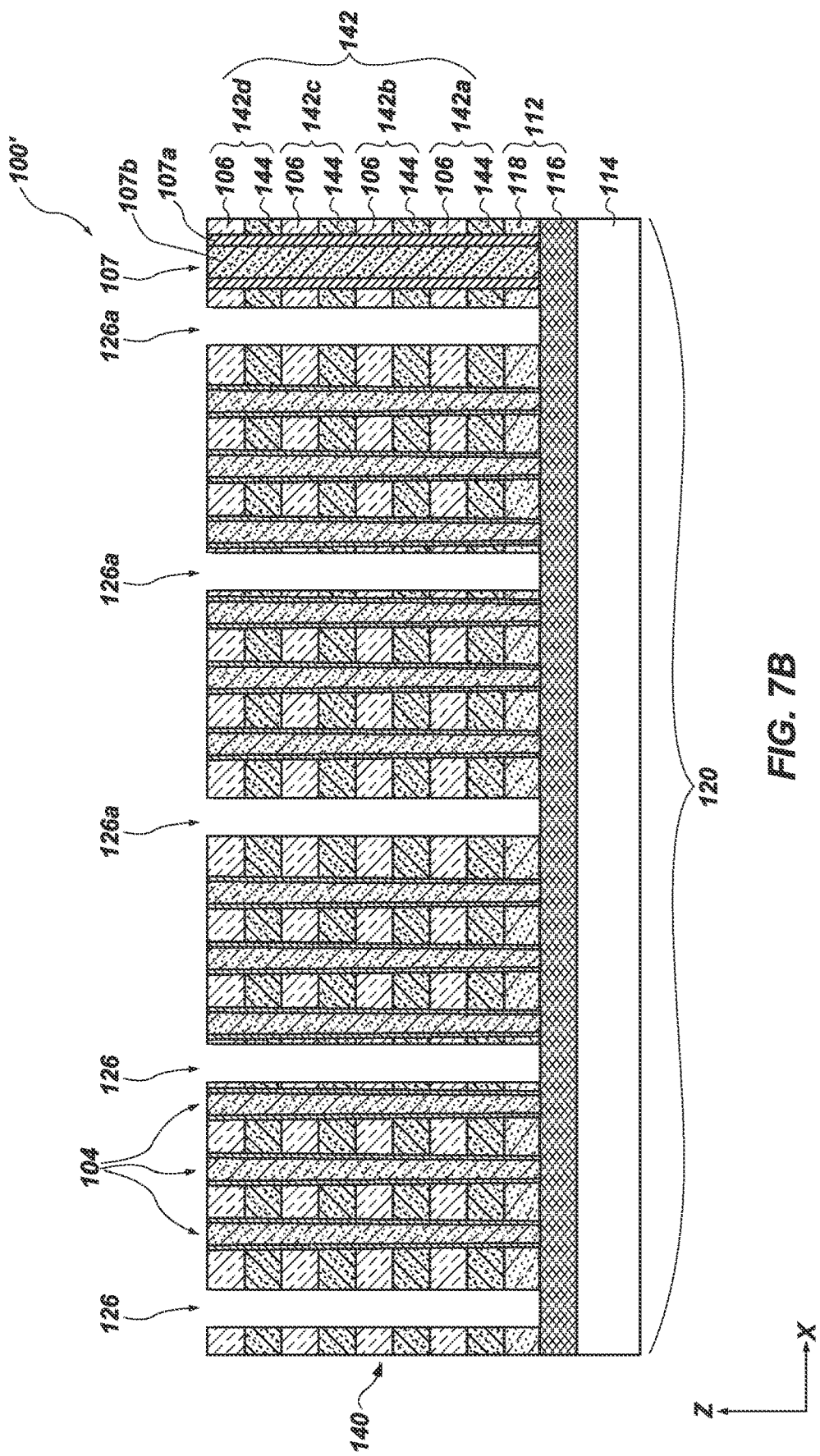
Figure 7C:
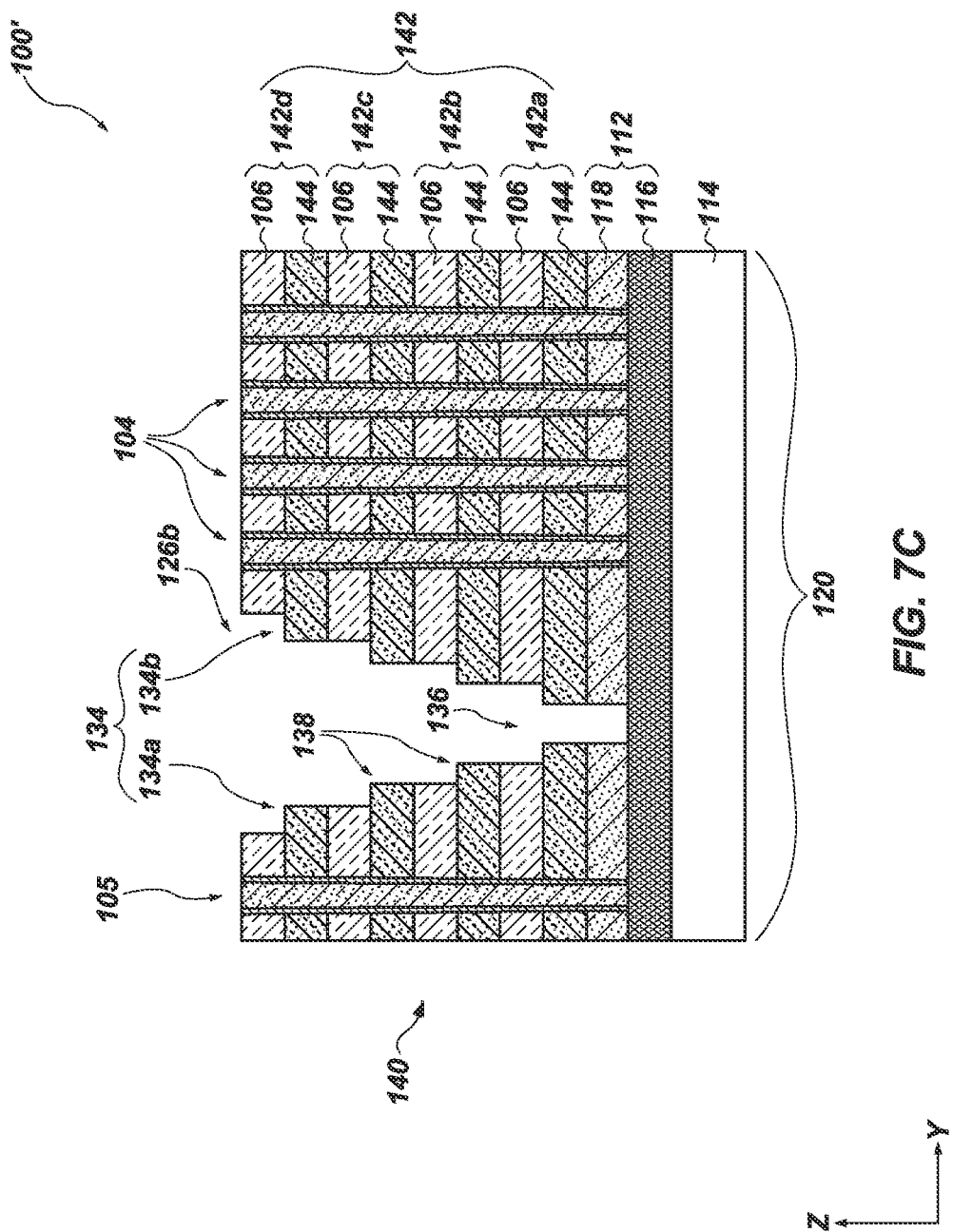

Referring next to FIG. 7A, the microelectronic device structure 100' at the processing stage depicted in FIGS. 6A through 6C may be subjected to a "replacement gate" or "gate last" process to convert the preliminary stack structure 102 (FIGS. 6B and 6C) into the stack structure 140 (FIGS. 7B and 7C). FIGS. 7B and 7C are simplified, partial cross-sectional views of the microelectronic device structure 100' (about the line B-B and the line C-C, respectively) at the processing stage shown in FIG. 7A. For clarity and ease of understanding of the drawings and related description, not all features depicted in one of FIGS. 7A through 7C are depicted in the other of FIGS. 7A through 7C.

As shown in FIGS. 7B and 7C, the stack structure 140 may be formed to include the vertically alternating (e.g., in the Z-direction) sequence of the insulating structures 106 and the conductive structures 144 arranged in the tiers 142 (e.g., the tiers 142a-142d). A quantity of the tiers 142 in the stack structure 140 may correspond to (e.g., be the same as) the quantity of the tiers 110 (FIGS. 6B and 6C) included in the preliminary stack structure 102 (FIGS. 6B and 6C). Each of the tiers 142 of the stack structure 140 may include an insulating structure 106 and a conductive structure 144 vertically adjacent the insulating structure 106. During the formation of the conductive structures 144, the configuration of the stadium structure 134 underlying the relatively wider portion 126b of the first trenches 126 may inhibit (e.g., prevent) the undesirable tier deformations (e.g., tier warping) and/or tier collapse during the formation of the tiers 142 by reducing an offset margin of the first pillar structures 104 to the first trenches 126 and the second trench 128, such as to mitigate the risk of undesirable current leakage and short circuits by providing increased structural support during use and operation of a microelectronic device (e.g., a memory device, such as a 3D NAND Flash memory device) including the microelectronic device structure 100'.

Figure 8A:
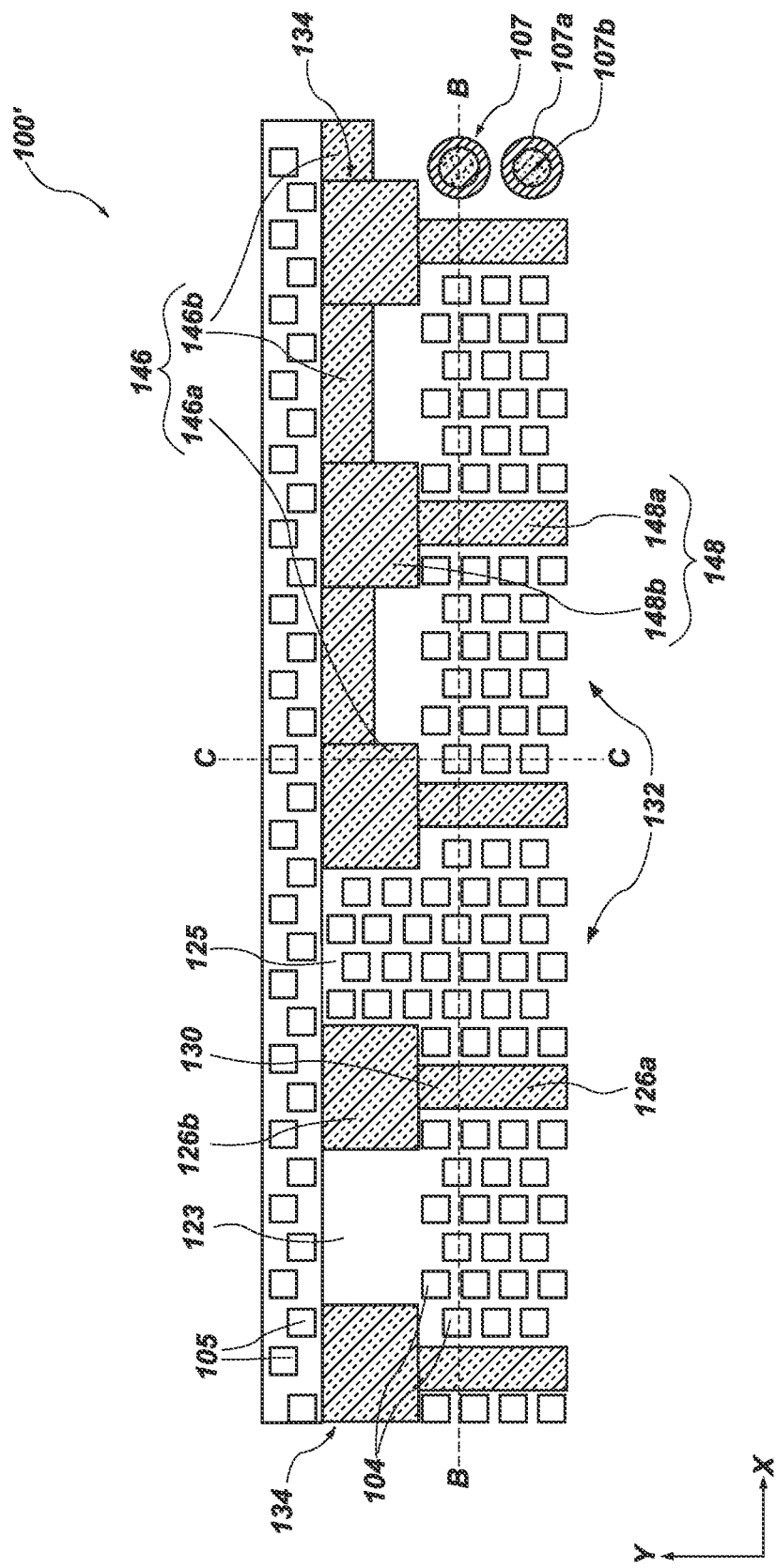
Figure 8B:
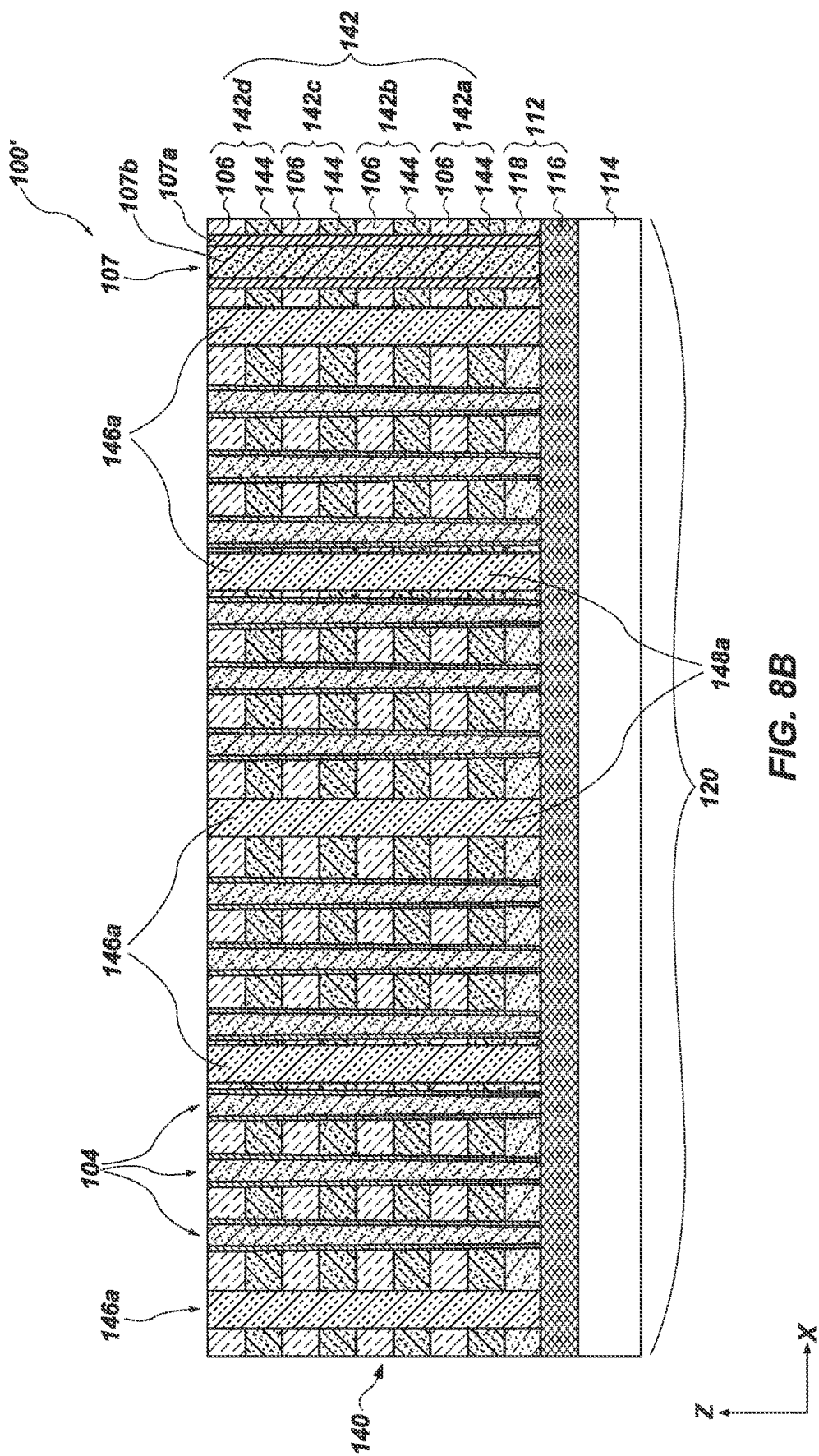
Figure 8C:
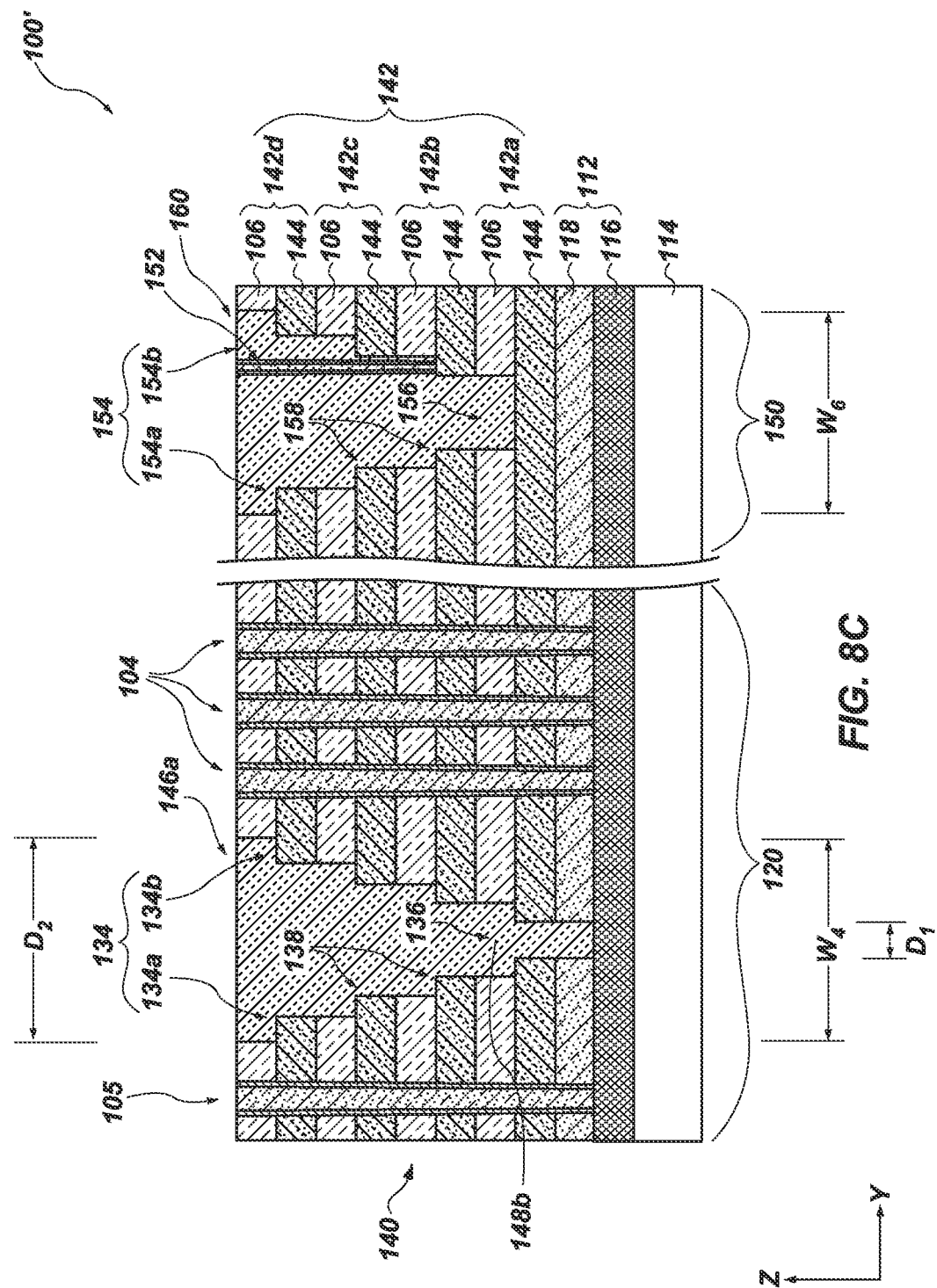

Referring next to FIG. 8A, the dielectric material 146 may be formed within the first trenches 126 (FIG. 7A) and the at least one second trench 128 (FIG. 7A). The dielectric material 146 may at least partially fill the relatively narrower portion 126a of the first trenches 126 and the relatively wider portion 126b thereof, including the stadium structure 134, and the second trench 128. The dielectric material 146 may include regions 148 of the dielectric material 146 within adjacent portions of the first trenches 126. The microelectronic device structure 100' may further include a staircase region 150 (FIG. 8C) (e.g., an access line contact region) horizontally neighboring (e.g., in the X-direction) the array region 120. FIGS. 8B and 8C are simplified, partial cross-sectional views of the microelectronic device structure 100' (about the line B-B and the line C-C, respectively) at the processing stage shown in FIG. 8A. For clarity and ease of understanding of the drawings and related description, not all features depicted in one of FIGS. 8A through 8C are depicted in the other of FIGS. 8A through 8C.

As shown in FIG. 8A, the dielectric material 146 may include regions 148 including first regions 148a (e.g., non-staircase regions) within the relatively narrower portion 126a (FIG. 7A) of each of the first trenches 126 (FIG. 7A) and second regions 148b (e.g., stadium regions) within the relatively wider portions 126b (FIG. 7A) of each of the first trenches 126 (FIG. 7A). First portions 146a of the dielectric material 146, which individually include one of the first regions 148a and one of the second regions 148b, the may extend in the Y-direction and may horizontally intervene (e.g., in the X-direction) between the horizontally neighboring blocks 132 of the stack structure 140. Second portions 146b of the dielectric material 146 may interact with the first portions 146a of the dielectric material 146 at the intersections 130 and may extend in the X-direction. As shown in FIG. 8A, one or more of the isolation regions 123 and the additional pillar regions 125 may extend between at least some of the second regions 148b of the dielectric material 146, without forming portions of the second portions 146b of the dielectric material 146 therein.

As shown in FIG. 8B, each of the first portions 146a of the dielectric material 146 may vertically extend completely through the stack structure 140. For example, each of the first portions 146a of the dielectric material 146 may vertically extend (e.g., in the Z-direction) from a vertically uppermost boundary of a vertically uppermost tier 142 (e.g., the fourth tier 142d) of the stack structure 140 to a vertically uppermost boundary of the source structure 116 underlying the stack structure 140. Additional portions of the first portions 146a of the dielectric material 146 may also vertically extend completely through the tiers 142 of the stack structure 140, as shown in FIG. 8C. Since the relatively narrower portion 126a of each of the first trenches 126 (FIG. 7B) and the second trench 128 (FIG. 7A) outside of horizontal areas of the intersections 130 may be defined by substantially linear sidewalls in the Z-direction of the preliminary stack structure 102 (FIG. 7B), the first portions 146a of the dielectric material 146 within the first region 148a of the regions 148 thereof and the second portions 146b of the dielectric material 146 may include substantially linear sidewalls in contact (e.g., direct contact) and coincident with the substantially linear sidewalls of the stack structure 140 (e.g., including the substantially linear sidewalls of the insulating structures 106 and the conductive structures 144 thereof). In addition, since the relatively wider portion 126b of the first trenches 126 (FIG. 7C) may include the stepped vertical cross-sectional shape, the first portions 146a of the dielectric material 146 within the second regions 148b of the regions 148 thereof may also include a stepped vertical cross-sectional shape in contact (e.g., direct contact) and coincident with a stepped vertical cross-sectional shape of stadium structure 134. Further, segmented portions of the first portions 146a of the dielectric material 146 within the second regions 148b of the regions 148 thereof may be discontinuous and discrete from one another, as shown in FIG. 8A.

Referring to FIG. 8C, features (e.g., regions, structures, materials, trenches, devices) of the staircase region 150 may be formed during formation of features of the array region 120 in order to simplify manufacturing processes. For ease of understanding the disclosure, formation of the array region 120 of the microelectronic device structure 100' is illustrated in FIGS. 5A through 8C, and the staircase region 150, as formed, is illustrated in FIG. 8C. However, one of ordinary skill in the art will recognize and appreciate that the features of the staircase region 150 may be formed during (e.g., substantially simultaneous with) formation of features of the array region 120.

As shown in FIG. 8C, the staircase region 150 may be formed to include at least one stadium structure 154 including a stair step structure 154a and an additional stair step structure 154b separated from one another by a valley 156, as shown in the embodiment of FIG. 8C. The stair step structure 154a and the additional stair step structure 154b may each have steps 158 comprising edges (e.g., horizontal ends) of the tiers 142 of the stack structure 140. The stair step structure 154a and the additional stair step structure 154b of the structure 154 may each individually include a desired quantity of the steps 158, such as greater or equal to eight (8) of the steps 158, greater than or equal to sixteen (16) of the steps 158, greater or equal to than thirty-two (32) of the steps 158, greater than or equal to sixty-four (64) of the steps 158, greater than or equal to one-hundred and twenty-eight (128) of the steps 158, or greater than or equal to two-hundred and fifty-six (256) of the steps 158.

The stadium structure 154 within the staircase region 150 and the stadium structure 134 within the array region 120 may be formed using conventional material removal (e.g., masking and etching) processes, which are not described in detail herein. Processing acts employed to form the stadium structure 154 may be substantially similar to processing acts employed to form the stadium structure 134.

In additional embodiments, the stadium structure 154 exhibits a different configuration than that depicted in FIG. 8C. As a non-limiting example, the stadium structure 154 may be modified to include the stair step structure 154a but not the additional stair step structure 154b (e.g., the additional stair step structure 154b may be absent), or the stadium structure 154 may be modified to include the additional stair step structure 154b but not the stair step structure 154a (e.g., the stair step structure 154a may be absent). As shown in FIG. 8C, in some embodiments, the stair step structure 154a mirrors the additional stair step structure 154b. The stair step structure 154a and the additional stair step structure 154b may exhibit the same quantity of steps 158 as one another, and corresponding steps 158 of the stair step structure 154a and the additional stair step structure 154b may be positioned at substantially the same vertical elevations as one another. In additional embodiments, the stair step structure 154a does not mirror the additional stair step structure 154b. The stair step structure 154a and the additional stair step structure 154b may exhibit different quantities of steps 158 than one another, and/or vertical elevations of steps 158 of the stair step structure 154a may be at least partially different than vertical elevations of steps 158 of the additional stair step structure 154b. In addition, each of the steps 158 of the stadium structure 154 (e.g., each of the steps 158 of the stair step structure 154a, each of the steps 158 of the additional stair step structure 154b) may exhibit substantially the same horizontal width in the Y-direction, or one or more of the steps 158 of the stadium structure 154 may exhibit a different horizontal width in the Y-direction than one or more other of the steps 158 of the stadium structure 154.

In some embodiments, at least some (e.g., each) of the steps 138 of the stair step structures 134a, 134b of the stadium structure 134 may be formed to depths (e.g., in the Z-direction) substantially the same that depths of the steps 158 of the stair step structures 154a, 154b of the stadium structure 154. Widths in the Y-direction of the steps 138 may or may not be different than widths in the Y-direction of the steps 158. As shown in FIG. 8C, in additional embodiments, a configuration and/or a spacing of at least some of the steps 138 of the stair step structures 134a, 134b of the stadium structure 134 is different than a configuration and/or a spacing of the steps 158 of the stair step structures 154a, 154b of the stadium structure 154. In some such embodiments, sizes (e.g., widths in the Y-direction) of the steps 158 are relatively greater than additional sizes (e.g., widths in the Y-direction) of the steps 138. As shown in FIG. 8C, each of the stadium structure 134 within the array region 120 and the stadium structure 154 within the staircase region 150 may be oriented in the same horizontal direction (e.g., the X-direction) as one another.

Still referring to FIG. 8C, the stadium structure 134 within the array region 120 may have a maximum width $W_4$ in the X-direction, and the stadium structure 154 within the staircase region 150 may have an additional maximum width $W_6$ in the X-direction. The maximum width $W_4$ of the stadium structure 134 may be substantially the same as (e.g., substantially equal to) the additional maximum width $W_6$ of the stadium structure 154, or the maximum width $W_4$ of the stadium structure 134 may be different than (e.g., not equal to) the additional maximum width $W_6$ of the stadium structure 154. By way of non-limiting example, each of the maximum width $W_4$ of the stadium structure 134 and the additional maximum width $W_6$ of the stadium structure 154 may be within a range from about 500 nm (e.g., 0.5 μm) to about 2000 nm (e.g., 2 μm), such as within a range from about 500 nm to about 1000 nm, within a range from about 1000 nm to about 1500 nm, or within a range from about 1500 nm to about 2000 nm, although other configurations may be contemplated. For example, one or more of the maximum width $W_4$ and the additional maximum width $W_6$ may be within a range from about 2 μm to about 4 μm, within a range from about 4 μm to about 6 μm, within a range from about 6 μm to about 8 μm, or even larger, depending on design requirements of the microelectronic device structure 100. In some embodiments, the maximum width $W_4$ is selected to facilitate a desired horizontal distance between the relatively wider portion 126b of the first trenches 126 (FIG. 7A) and the neighboring blocks 132 (FIG. 7A) and a horizontal spacing (e.g., in the X-direction) between neighboring blocks 132; and the additional maximum width $W_6$ is selected to facilitate formation of conductive contact structures on the steps 158 of the stadium structure 154, as described in further detail below.

As shown in FIG. 8C, the conductive structures 144 at a vertically lowermost tier 142 (e.g., the first tier 142a) of the stack structure 140 are separated from one another, by lower sections of the second portions 146b of the dielectric material 146, by a first distance $D_1$ in the Y-direction; and the conductive structures 144 at a vertically uppermost tier 142 (e.g., the fourth tier 142d) are separated from one another, by upper sections of the second portions 146b of the dielectric material 146, by a second distance $D_2$ in the Y-direction. The second distance $D_2$ is greater than the first distance $D_1$. In other words, the conductive structures 144 of the vertically lowermost tier 142 may exhibit a width in the Y-direction that is relatively greater than a width of the conductive structures 144 of the vertically uppermost conductive tier 142 within individual blocks 132 (FIG. 8A) of the stack structure 140. By way of non-limiting example, the first distance $D_1$ may be within a range from about 100 nm to about 400 nm, such as within a range from about 100 nm to about 200 nm, within a range from about 200 nm to about 300 nm, or within a range from about 300 nm to about 400 nm; and the second distance $D_2$ may be within a range from about 500 nm (e.g., 0.5 μm) to about 2000 nm (e.g., 2 μm), such as within a range from about 500 nm to about 1000 nm, within a range from about 1000 nm to about 1500 nm, or within a range from about 1500 nm to about 2000 nm, although other configurations may be contemplated. For example, the second distance $D_2$ may be within a range from about 2 μm to about 4 μm, within a range from about 4 μm to about 6 μm, within a range from about 6 μm to about 8 μm, or even larger, depending on design requirements of the microelectronic device structure 100.

With continued reference to FIG. 8C, a dielectric material 160 may be formed within an opening (e.g., trench) at least partially defined by the stadium structure 154. The dielectric material 160 may at least partially fill the opening. Formation of the dielectric material 160 may be similar to formation of the dielectric material 146. Further, the dielectric material 160 of stadium structure 154 may be formed during (e.g., substantially simultaneous with) formation of the dielectric material 146 so as to simplify manufacturing processes.

As shown in FIGS. 8A through 8C, the stadium structure 134 and each of the first pillar structures 104, the second pillar structures 105, and the support structures 107, if present, may be confined within the array region 120 and the stadium structure 154 may be confined to the staircase region 150. In some embodiments, at least some of the first pillar structures 104 horizontally intervene in the X-direction between the first portions 146a of the dielectric material 146 within a horizontal area of the stadium structure 134 and the dielectric material 160 within a horizontal area of the stadium structure 154. In other embodiments, at least some of the stadium structures 134 may be formed around a perimeter of one or more of the array region 120 and the staircase region 150. Additional support structures (e.g., the support structures 107) may, optionally, be located within or proximate to a horizontal area of the stadium structure 154 within the staircase region 150.

The stadium structure 134 may vertically extend to or beyond a vertically lowermost boundary of a vertically lowermost tier 142 (e.g., the tier 142*a*) of the stack structure 140. In addition, the stadium structure 154 may vertically extend to or above vertically lowermost boundary of the vertically lowermost tier 142 of the stack structure 140. In some embodiments, the stadium structure 154 vertically extends through the stack structure 140 without extending to the vertically lowermost boundary of the vertically lowermost tier 142 of the stack structure 140, as shown in FIG. 8C. Each of dielectric material 146 within a horizontal area of the stadium structure 134 and the pillar structures 104 may directly contact the source tier 112; and the dielectric material 160 within the stadium structure 154 may be separated from the source structure 116 of the source tier 112 by one or more of a conductive material (e.g., a lowermost conductive structure 144) and an insulating material (e.g., a lowermost insulating structure 106 of the preliminary stack structure 102, the insulating structure 118 of the source tier 112). Accordingly, lowermost surfaces of the dielectric material 146 (e.g., the first portions 146*a* thereof) within the stadium structure 134 may be substantially coplanar with lowermost surfaces of the pillar structures 104.

With continued reference to FIG. 8C, conductive contact structures 152 may be formed to contact (e.g., physically contact, electrically contact) at least some of the steps 158 of the stadium structure 154 within the staircase region 150. For example, the conductive contact structures 152 may extend through the dielectric material 160 to individually contact at least some of the conductive structures 144 of the stack structure 140 at the steps 158 of the stadium structure 154. The conductive contact structures 152 may be formed of and include conductive material. Optionally, the conductive contact structures 152 may also include a liner surrounding the conductive material and comprising insulative material. In some embodiments, the liner of the conductive contact structures 152 comprises a silicon oxide material, such as an ALD $SiO_x$. In some embodiments, the conductive material of the conductive contact structures 152 comprises the same material composition as the conductive structures 144. Upper surfaces of the conductive contact structures 152 may be planarized, such as by one or more CMP acts to facilitate or enhance the planarity of upper boundaries (e.g., upper surfaces) of the conductive contact structures 152 for further processing thereon. While one conductive contact structure 152 is shown in FIG. 8C for clarity, additional conductive contact structures 152 may be formed within the horizontal area of stadium structure 154.

As shown in FIG. 8C, in some embodiments, the stadium structure 134 of the array region 120 is substantially free of conductive contact structures formed on the steps 138 thereof (e.g., on the steps 138 of the stair step structure 134*a* and the additional stair step structure 134*b* of the stadium structure 134). Stated another way, the conductive contact structures 152 may be formed within the stadium structure 154 of the staircase region 150 without forming the conductive contact structures 152 within the stadium structure 134 of the memory array region 120. In additional embodiments, one or more conductive contact structures (e.g., conductive contacts, live contacts) are formed within openings in the first portions 146*a* of the dielectric material 146 to physically and electrically contact the at least some of the conductive structures 144 at least partially defining the steps of the stadium structure 134 to access lines coupled to logic circuitry (e.g., string drive circuitry) within the base structure 114. Further, support structures (e.g., the support structures 107) may, optionally, be formed to extend vertically through the first portions 146*a* of the dielectric material 146 and portions of the stack structure 140 within a horizontal area of the stadium structure 134. If present, such support structures may be sized, shaped, positioned, and spaced to provide structural support to the preliminary stack structure 102 (FIGS. 6B and 6C) during the "replacement gate" processing acts performed on the microelectronic device structure 100'. Following the formation of the dielectric material 146, the microelectronic device structure 100' may be subjected to additional processing.

Thus, in accordance with embodiments of the disclosure, a method of forming a microelectronic device comprises forming a stack structure over a source structure, the stack structure comprising insulating structures and additional insulating structures arranged in tiers. Each of the tiers individually comprises one of the insulating structures and one of the additional insulating structures vertically adjacent the one of the insulating structures. The method comprises forming pillar structures vertically extending through the stack structure from an upper surface of the stack structure to an upper surface of the source structure, and forming at least one trench vertically extending through the stack structure and horizontally extending in a first direction. The at least one trench defines at least one stadium structure comprising opposing stair step structures having steps comprising horizontal ends of the tiers. The method comprises forming additional trenches vertically extending through the stack structure and horizontally extending in a second direction transverse to the first direction, and forming at least one further trench vertically extending through the stack structure and horizontally extending in the first direction. The at least one further trench defines at least one additional stadium structure comprising additional opposing stair step structures having additional steps comprising additional horizontal ends of the tiers. The method comprises forming a dielectric material within the at least one trench, the additional trenches, and the at least one further trench.

Figure 9:
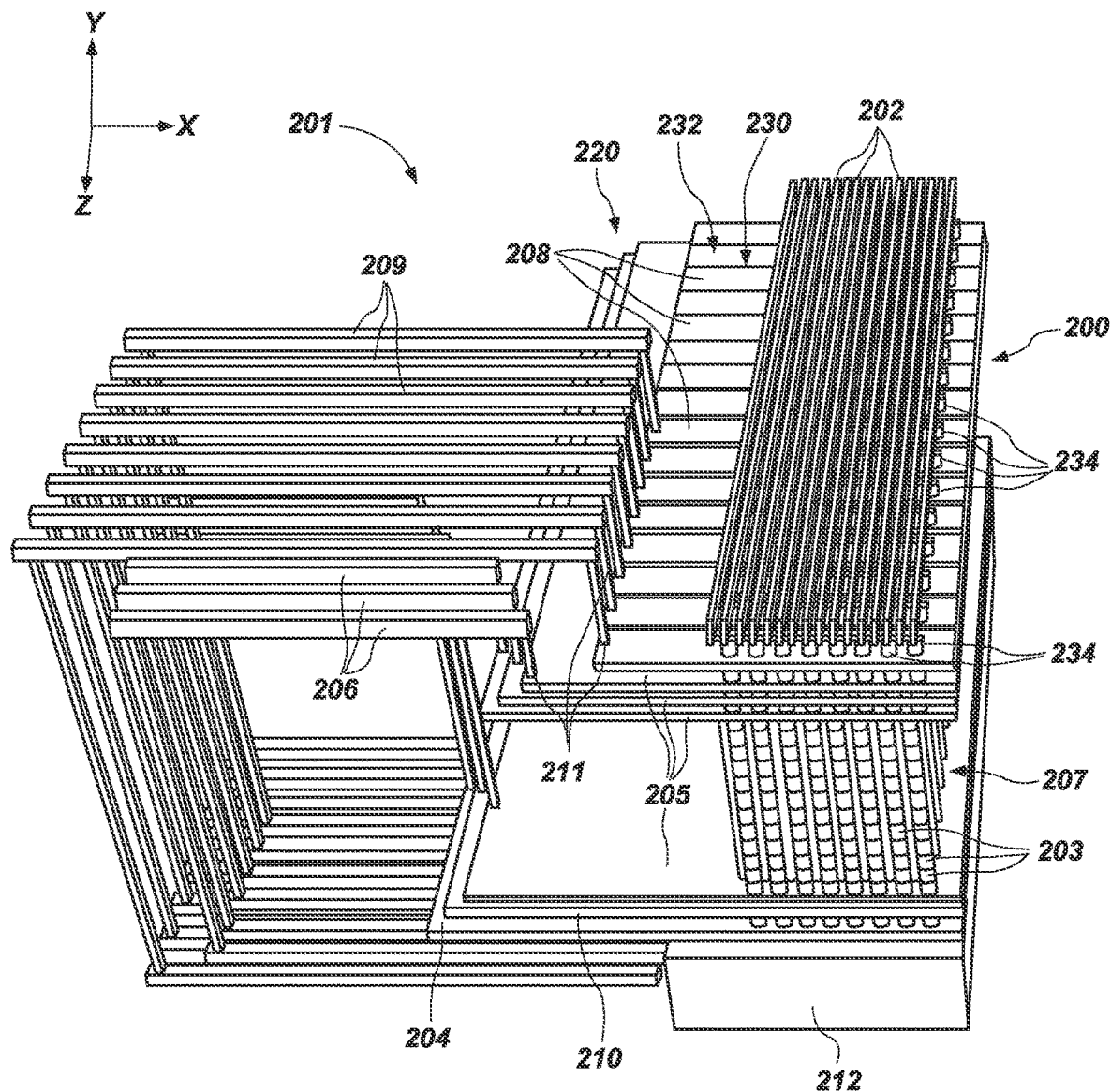
FIG. 9 is a simplified, partial cutaway perspective view of a microelectronic device, in accordance with embodiments of the disclosure.

FIG. 9 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to one of the microelectronic device structures 100, 100' previously described with reference to FIGS. 4A through 4C and 8A through 8C. As shown in FIG. 9, the microelectronic device structure 200 may include a staircase structure 220 (e.g., corresponding to the stadium structure 154 within the staircase region 150 (FIG. 8C)) defining contact regions for connecting access lines 206 to conductive structures 205 (e.g., corresponding to the conductive structures 144 (FIGS. 4C and 8C)). The microelectronic device structure 200 may also include vertically extending strings 207 of memory cells 203 that are coupled to each other in series. The vertically extending strings 207 may extend orthogonal to the conductive structures 205 and to conductive lines, such as data lines 202, a source tier 204 (e.g., corresponding to the source tier 112 (FIGS. 4C and 8C)), the access lines 206, first select gates 208 (e.g., upper select gates, drain select gates (SGDs)), select lines 209, and a second select gate 210 (e.g., a lower select gate, a source select gate (SGS)). The microelectronic device 201 may include multiple blocks 232 (e.g., corresponding to the blocks 132 (FIGS. 2A and 6A)) horizontally separated (e.g., in the Y-direction) from one another by filled slots 230 (e.g., corresponding to the first trenches 126 (FIGS. 3A and 7A)

and the second trench 128 (FIGS. 3A and 7A) filled with the dielectric material 146 (FIGS. 4A and 8A)). Vertical conductive contacts 211 may electrically couple components to each other as shown. For example, the select lines 209 may be electrically coupled to the first select gates 208 and the access lines 206 may be electrically coupled to the conductive structures 205. The microelectronic device 201 may also include a control unit 212 (e.g., corresponding to the base structure 114 (FIGS. 1B and 5B)) positioned under the and within a horizontal area of a memory array including the vertically extending strings 207 of memory cells 203.

Thus, in accordance with embodiments of the disclosure, a microelectronic device comprises a stack structure overlying a source structure. The stack structure comprises a vertically alternating sequence of insulating structures and conductive structures arranged in tiers. Each of the tiers individually comprise one of the insulating structures and one of the conductive structures. The microelectronic device comprises at least one dielectric-filled trench substantially vertically extending through the stack structure and horizontally extending in a first direction. The at least one dielectric-filled trench defines at least one stadium structure comprising staircase structures horizontally opposing one another in a second direction orthogonal to the first direction and each having steps comprising horizontal ends of the tiers. The microelectronic device comprises additional dielectric-filled trenches substantially vertically extending through the stack structure and horizontally extending in the second direction, and at least one further dielectric-filled trench at least partially vertically extending through the stack structure and horizontally extending in the first direction. The at least one further dielectric-filled trench defines at least one additional stadium structure comprising additional staircase structures horizontally opposing one another in the second direction and each having additional steps comprising additional horizontal ends of the tiers. The microelectronic device comprises pillar structures vertically extending through the stack structure from an upper surface of the stack structure to an upper surface of the source structure.

Thus, in accordance with additional embodiments of the disclosure a memory device comprises a stack structure comprising insulating structures and conductive structures arranged in tiers. Each of the tiers individually comprises one of the insulating structures and one of the conductive structures vertically adjacent the one of the insulating structures. The memory device comprises a stadium structure comprising opposing stair step structures having steps comprising horizontal ends of the tiers. The stadium structure has a lower boundary at or below lowermost boundary of the stack structure. The memory device comprises an additional stadium structure horizontally neighboring the stadium structure and comprising additional opposing stair step structures having additional steps comprising additional horizontal ends of the tiers, and pillar structures vertically extending through the stack structure from an uppermost boundary of the stack structure to the lowermost boundary of the stack structure. The pillar structures are proximate the stadium structure and horizontally intervene between the stadium structure and the additional stadium structure.

Figure 10:
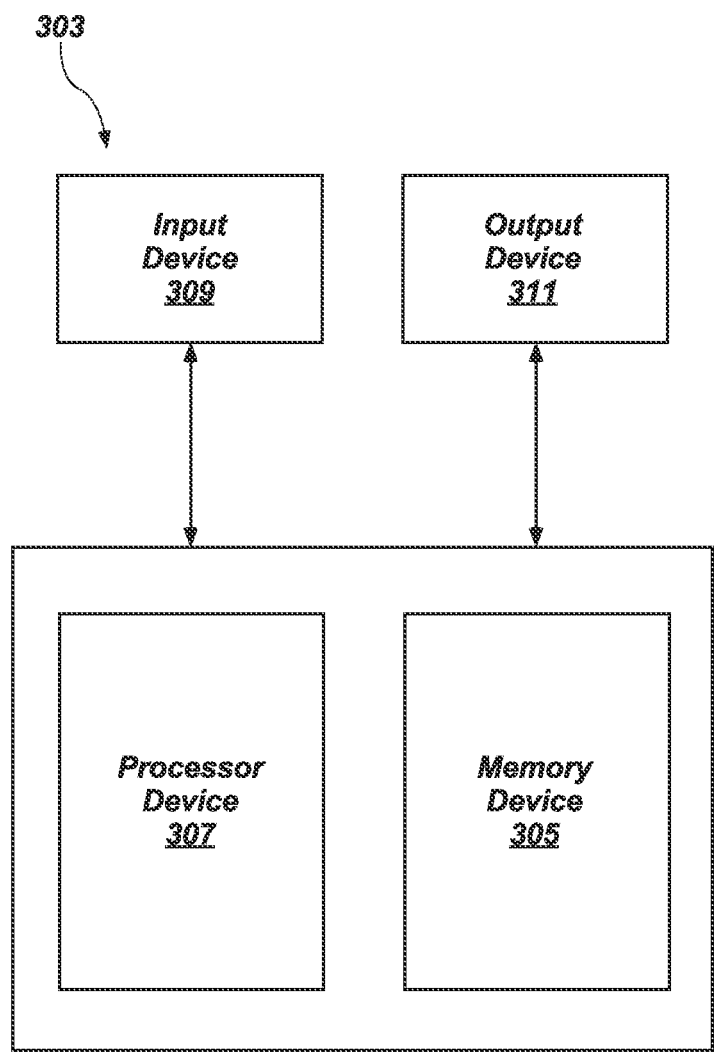
FIG. 10 is a schematic block diagram of an electronic system, in accordance with embodiments of the disclosure.

Microelectronic devices (e.g., the microelectronic device 201 shown in FIG. 9) including microelectronic device structures (e.g., the microelectronic device structures 100, 100' described with reference to FIGS. 4A through 4C and FIGS. 8A through 8C) in accordance with embodiments of the disclosure may be used in embodiments of electronic systems of the disclosure. For example, FIG. 10 is a schematic block diagram of an illustrative electronic system 303 according to embodiments of disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 303 includes at least one memory device 305. The memory device 305 may comprise, for example, an embodiment of a microelectronic device (e.g., the microelectronic device 201 shown in FIG. 9) previously described herein.

The electronic system 303 may further include at least one electronic signal processor device 307 (often referred to as a "microprocessor"). The electronic signal processor device 307 may, optionally, include an embodiment a microelectronic device (e.g., the microelectronic device 201 shown in FIG. 9) previously described herein. While the memory device 305 and the electronic signal processor device 307 are depicted as two (2) separate devices in FIG. 10, in additional embodiments, a single (e.g., only one) memory/processor device having the functionalities of the memory device 305 and the electronic signal processor device 307 is included in the electronic system 303. In such embodiments, the memory/processor device may include an embodiment of a microelectronic device structure (e.g., the microelectronic device structures 100, 100' described with reference to FIGS. 4A through 4C and FIGS. 8A through 8C) previously described herein, and/or an embodiment of a microelectronic device (e.g., the microelectronic device 201 shown in FIG. 9) previously described herein. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 11:
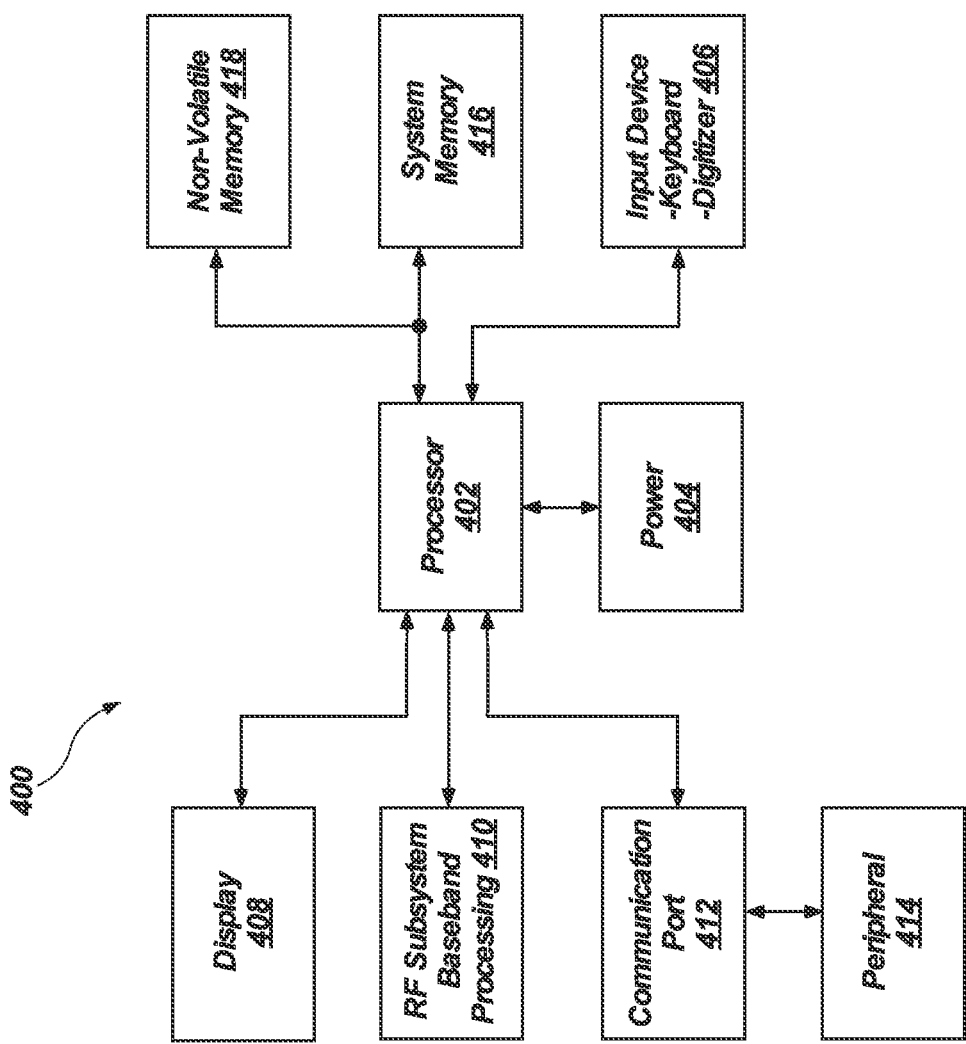
FIG. 11 is a schematic block diagram of a processor-based system, in accordance with embodiments of the disclosure.

With reference to FIG. 11, depicted is a processor-based system 400. The processor-based system 400 may include various microelectronic device structures (e.g., the microelectronic device structures 100, 100') manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include microelectronic device structures (e.g., the microelectronic device structures 100, 100') manufactured in accordance with embodiments of the disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the microelectronic device structures (e.g., the microelectronic device structures 100, 100') described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic device structures, such as the microelectronic device structures (e.g., the microelectronic device structures 100, 100') described above, or a combination thereof.

Thus, in accordance with embodiments of the disclosure, an electronic system comprises a processor operably coupled to an input device and an output device, and a memory device operably coupled to the processor. The memory device comprises a stack structure comprising dielectric materials and conductive materials vertically alternating with the dielectric materials, a first stadium structure within a memory array region of the stack structure and comprising steps partially defined by horizontal ends of the conductive materials of the stack structure, a second stadium structure within a contact region of the stack structure and comprising additional steps partially defined by additional horizontal ends of the conductive materials of the stack structure, and strings of memory cells within the memory array region of the stack structure and vertically extending through the stack structure. At least some of the strings of memory cells are horizontally interposed between the first stadium structure and the second stadium structure.

The methods, structures (e.g., the microelectronic device structures 100, 100'), devices (e.g., the microelectronic device 201), systems (e.g., the electronic system 303, the processor-based system 400) of the disclosure advantageously facilitate one or more of improved performance, reliability, and durability, lower costs, increased miniaturization of components, improved pattern quality, and greater packaging density as compared to conventional structures, conventional devices, and conventional systems. The methods and structures of the disclosure may substantially alleviate problems related to the formation and processing of conventional microelectronic device structures including conductive stack structures. For example, the methods and structures of the disclosure may reduce the risk of undesirable current leakage and short circuits by impeding undesirable tier deformations (e.g., tier warping) and/or tier collapse during the formation of the conductive tiers of the conductive stack structures as compared to conventional methods and conventional structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a microelectronic device, comprising:
   forming a stack structure over a source structure, the stack structure comprising a vertically alternating sequence of insulating structures and additional insulating structures arranged in tiers, each of the tiers individually comprising one of the insulating structures and one of the additional insulating structures vertically adjacent the one of the insulating structures;
   forming pillar structures vertically extending through the stack structure from an upper surface of the stack structure to an upper surface of the source structure, the stack structure including a memory array region and a staircase region horizontally neighboring the memory array region;

forming at least one trench within the memory array region, the at least one trench vertically extending through the stack structure and horizontally extending in a first direction, the at least one trench defining at least one stadium structure comprising staircase structures horizontally opposing one another in a second direction orthogonal to the first direction and each having steps comprising horizontal ends of the tiers, the at least one trench substantially free of conductive contact structure on the steps of the at least one stadium structure;

forming additional trenches vertically extending through the stack structure and horizontally extending in the second direction;

forming at least one further trench at least partially vertically extending through the stack structure and horizontally extending in the first direction, the at least one further trench defining at least one additional stadium structure comprising additional staircase structures horizontally opposing one another in the second direction and each having additional steps comprising additional horizontal ends of the tiers;

removing the additional insulating structures and forming conductive structures between vertically neighboring insulating structures; and forming dielectric material within the at least one trench, the additional trenches, and the at least one further trench.

2. The method of claim 1, wherein forming the conductive structures comprises forming conductive material between vertically neighboring insulating structures through the at least one trench and the additional trenches.

3. The method of claim 1, wherein forming the at least one trench and the additional trenches vertically extending through the stack structure comprises forming at least a portion of each of the at least one trench and the additional trenches from a vertically uppermost boundary of a vertically uppermost tier of the stack structure to a vertically lowermost boundary of a vertically lowermost tier of the stack structure.

4. The method of claim 1, wherein forming the at least one trench and the additional trenches comprises selectively removing portions of the insulating structures and the additional insulating structures using one or more material removal processes in combination with one or more chopping processes.

5. The method of claim 1, wherein forming the at least one trench comprises forming the at least one stadium structure to horizontally extend continuously under the at least one trench and in the first direction.

6. The method of claim 1, wherein:

forming the at least one trench comprises forming a trench exhibiting a substantially rectangular horizontal cross-sectional shape having a first lateral width in the first direction; and forming the additional trenches comprises forming an additional trench exhibiting a substantially rectangular horizontal cross-sectional shape having a second lateral width in the first direction greater than the first lateral width.

7. The method of claim 1, wherein forming the additional trenches comprises confining the additional trenches within or horizontally adjacent to the memory array region and external to the staircase region.

8. The method of claim 7, further comprising forming conductive contact structures on at least some of the additional steps of the at least one additional stadium structure without forming the conductive contact structures on the steps of the stadium structure.

9. The method of claim 7, further comprising forming the at least one additional stadium structure within the staircase region substantially simultaneously with forming the stadium structure within the memory array region.

10. The method of claim 7, further comprising forming at least some of the pillar structures to be horizontally interposed between the at least one stadium structure and the at least one additional stadium structure.

11. A microelectronic device, comprising:

a stack structure overlying a source structure, the stack structure comprising a vertically alternating sequence of insulating structures and conductive structures arranged in tiers, each of the tiers individually comprising one of the insulating structures and one of the conductive structures, the stack structure including a memory array region and a staircase region horizontally neighboring the memory array region;

at least one dielectric-filled trench within the memory array region of the stack structure, the at least one dielectric-filled trench substantially vertically extending through the stack structure and horizontally extending in a first direction, the at least one dielectric-filled trench defining at least one stadium structure comprising staircase structures horizontally opposing one another in a second direction orthogonal to the first direction and each having steps comprising horizontal ends of the tiers, the at least one dielectric-filled trench substantially free of conductive contact structures on the steps of the at least one stadium structure;

additional dielectric-filled trenches substantially vertically extending through the stack structure and horizontally extending in the second direction;

at least one further dielectric-filled trench at least partially vertically extending through the stack structure and horizontally extending in the first direction, the at least one further dielectric-filled trench defining at least one additional stadium structure comprising additional staircase structures horizontally opposing one another in the second direction and each having additional steps comprising additional horizontal ends of the tiers; and pillar structures vertically extending through the stack structure from an upper surface of the stack structure to an upper surface of the source structure.

12. The microelectronic device of claim 11, wherein the at least one stadium structure is horizontally interposed between a first portion of the pillar structures and a second portion of the pillar structures.

13. The microelectronic device of claim 11, wherein the additional dielectric-filled trenches divide the stack structure into multiple blocks comprising the pillar structures, the additional dielectric-filled trenches intersecting the at least one dielectric-filled trench at intersections, the additional dielectric-filled trenches including a stepped horizontal boundaries within horizontal areas of the intersections.

14. The microelectronic device of claim 11, wherein the pillar structures comprise one or more of memory pillars, dummy pillars, and mechanical support pillars, at least some of the memory pillars horizontally interposed between the at least one stadium structure and the at least one additional stadium structure.

15. The microelectronic device of claim 11, further comprising:
- conductive lines overlying the stack structure; and
- a control device electrically coupled to the conductive structures of the stack structure, the conductive lines, and the source structure.

16. The microelectronic device of claim 15, wherein the control device comprises complementary metal-oxide-semiconductor (CMOS) circuitry and is at least partially positioned within horizontal boundaries of and vertically below a region of the stack structure containing strings of memory cells.

17. The microelectronic device of claim 11, wherein the at least one further dielectric-filled trench is within the staircase region of the stack structure, and comprises a contact structure on at least one of the additional step of the at least one additional stadium structure.

18. A memory device, comprising:
- a stack structure comprising insulating structures and conductive structures arranged in tiers, each of the tiers individually comprising one of the insulating structures and one of the conductive structures vertically adjacent the one of the insulating structures, the stack structure comprising a memory array region and a staircase region horizontally neighboring the memory array region;
- a stadium structure within the memory array region of the stack structure, the stadium structure comprising opposing stair step structures having steps comprising horizontal ends of the tiers, the stadium structure substantially free of conductive contact structure on the steps of the stadium structure;
- an additional stadium structure within the staircase region, the additional stadium structure comprising additional opposing stair step structures having additional steps comprising additional horizontal ends of the tiers; and
- pillar structures vertically extending through the stack structure from an uppermost boundary of the stack structure to the lowermost boundary of the stack structure, the pillar structures proximate the stadium structure and horizontally intervening between the stadium structure and the additional stadium structure.

19. The memory device of claim 18, further comprising a source tier underlying the stack structure and comprising a source structure coupled to at least some of the pillar structures.

20. The memory device of claim 18, wherein at least some of the pillar structures comprise memory cell pillars defining vertically extending strings of memory cells within the stack structure.

21. An electronic system, comprising:
- a processor operably coupled to an input device and an output device; and
- a memory device operably coupled to the processor, the memory device comprising:
    - a stack structure comprising dielectric materials and conductive materials vertically alternating with the dielectric materials;
    - a first stadium structure within a memory array region of the stack structure and comprising steps partially defined by horizontal ends of the conductive materials of the stack structure, the first stadium structure substantially free of conductive contact structure on the steps of the first stadium structure;
    - a second stadium structure within a contact region of the stack structure and comprising additional steps partially defined by additional horizontal ends of the conductive materials of the stack structure; and
    - strings of memory cells within the memory array region of the stack structure and vertically extending through the stack structure, at least some of the strings of memory cells horizontally interposed between the first stadium structure and the second stadium structure.

22. The electronic system of claim 21, further comprising:
- a source structure underlying the stack structure and operably associated with the strings of memory cells; and
- complementary metal-oxide-semiconductor circuitry underlying and operably associated with the source structure.

23. The electronic system of claim 21, wherein the first stadium structure exhibits substantially the same shape and orientation as the second stadium structure.

24. The electronic system of claim 21, wherein the memory device comprises a 3D NAND Flash memory device.

* * * * *

UNITED STATES PATENT AND TRADEMARK OFFICE
CERTIFICATE OF CORRECTION

| | |
|---|---|
| PATENT NO. | : 12,154,825 B2 |
| APPLICATION NO. | : 17/447505 |
| DATED | : November 26, 2024 |
| INVENTOR(S) | : Raja Kumar Varma Manthena and Paolo Tessariol |

It is certified that error appears in the above-identified patent and that said Letters Patent is hereby corrected as shown below:

In the Specification

Column 5, Line 47, change "magnesium oxide (MgO)), at" to --magnesium oxide ($MgO_x$)), at--

Column 18, Line 63, change "and $MgO_x$) at least one" to --and $MgO_x$), at least one--

Signed and Sealed this
Seventh Day of January, 2025

Derrick Brent
*Acting Director of the United States Patent and Trademark Office*